United States Patent
Ode et al.

(10) Patent No.: US 11,349,073 B2
(45) Date of Patent: May 31, 2022

(54) SEMICONDUCTOR MEMORY DEVICE

(71) Applicant: Kioxia Corporation, Tokyo (JP)

(72) Inventors: Hiroyuki Ode, Yokkaichi Mie (JP); Kotaro Noda, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 77 days.

(21) Appl. No.: 17/021,655

(22) Filed: Sep. 15, 2020

(65) Prior Publication Data

US 2021/0296583 A1 Sep. 23, 2021

(30) Foreign Application Priority Data

Mar. 19, 2020 (JP) .............................. JP2020-049030

(51) Int. Cl.
*H01L 45/00* (2006.01)
*H01L 27/24* (2006.01)

(52) U.S. Cl.
CPC ...... *H01L 45/1253* (2013.01); *H01L 27/2463* (2013.01); *H01L 45/06* (2013.01); *H01L 45/1233* (2013.01)

(58) Field of Classification Search
None
See application file for complete search history.

(56) References Cited

U.S. PATENT DOCUMENTS

| | | |
|---|---|---|
| 7,863,751 B2 | 1/2011 | Takase |
| 8,363,472 B2 | 1/2013 | Nagashima |
| 8,441,040 B2 | 5/2013 | Minemura |
| 10,297,578 B2 | 5/2019 | Tagami et al. |
| 10,319,787 B2 | 6/2019 | Terada |

FOREIGN PATENT DOCUMENTS

| | | |
|---|---|---|
| JP | 2009-26867 A | 2/2009 |
| JP | 2010-171332 A | 8/2010 |
| JP | 2011-18838 A | 1/2011 |
| JP | 2011-71207 A | 4/2011 |
| TW | 201711166 A | 3/2017 |
| TW | 201933546 A | 8/2019 |

*Primary Examiner* — Mounir S Amer
(74) *Attorney, Agent, or Firm* — Foley & Lardner LLP

(57) ABSTRACT

A semiconductor memory device includes a first wiring to a fifth wiring, a plurality of memory cells disposed between the wirings, and a first contact electrode to a third contact electrode. The first contact electrode is disposed between the first wiring and the fifth wiring, and is electrically connected to the first wiring and the fifth wiring. The second contact electrode is disposed between the first contact electrode and the fifth wiring, and is electrically connected to the first wiring and the fifth wiring. The third contact electrode is disposed between the second contact electrode and the fifth wiring, and is electrically connected to the first wiring and the fifth wiring. The second contact electrode has a width larger than a width of the first contact electrode and larger than a width of the third contact electrode.

16 Claims, 28 Drawing Sheets

SEMICONDUCTOR MEMORY DEVICE

CROSS-REFERENCE TO RELATED APPLICATIONS

This application is based upon and claims the benefit of Japanese Patent Application No. 2020-049030, filed on Mar. 19, 2020, the entire contents of which are incorporated herein by reference.

BACKGROUND

Field

Embodiments described herein relate generally to a semiconductor memory device.

Description of the Related Art

There has been known a semiconductor memory device that includes a first wiring, a second wiring intersecting with the first wiring, and a memory cell disposed on an intersection portion between the first wiring and the second wiring.

DETAILED DESCRIPTION

Figure 1:
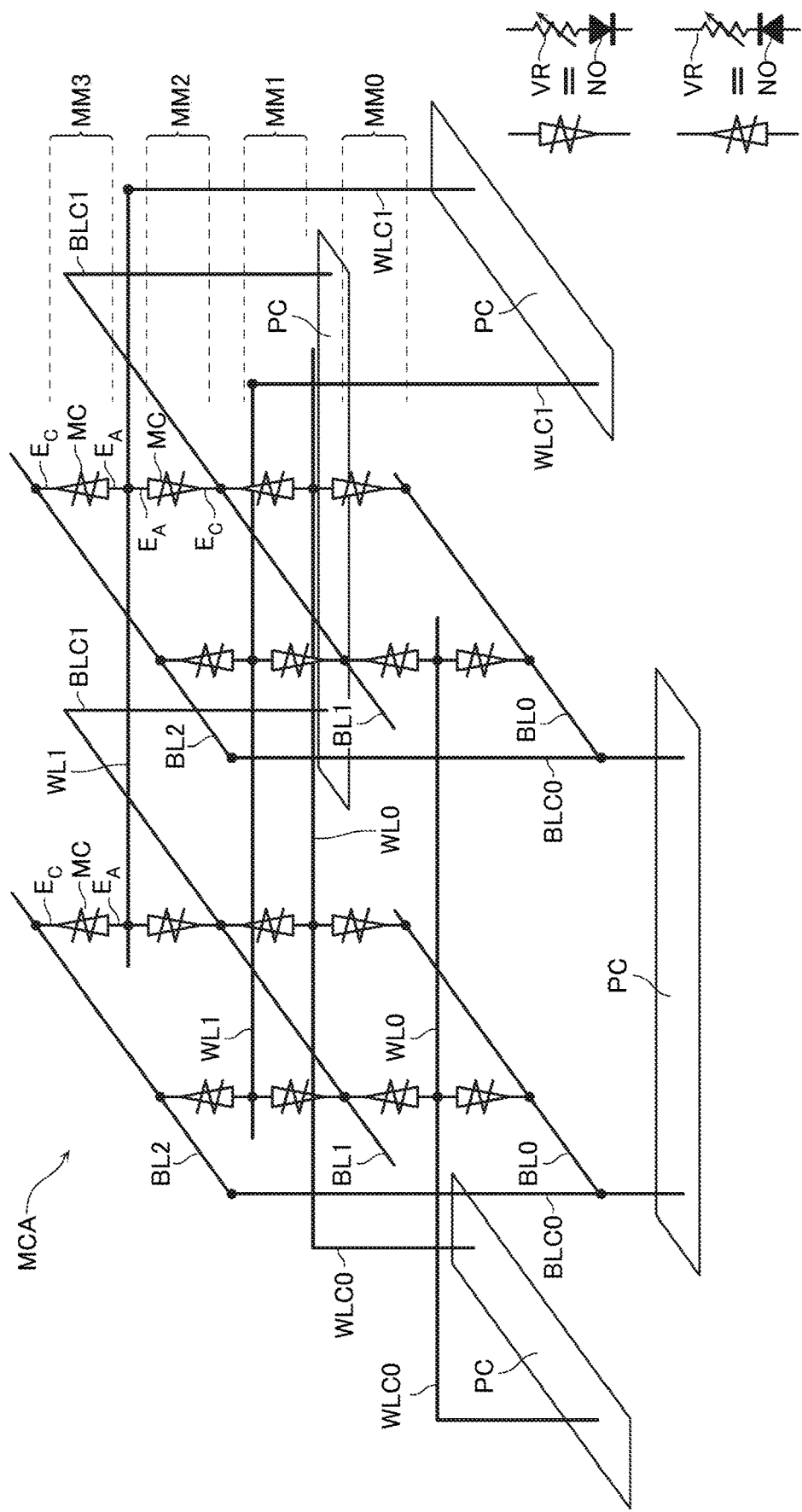
FIG. 1 is a schematic circuit diagram illustrating apart of a configuration of a semiconductor memory device according to a first embodiment.

A semiconductor memory device according to one embodiment includes: a substrate; a first wiring disposed to be separated from the substrate in a first direction that intersects with a surface of the substrate, the first wiring extending in a second direction that intersects with the first direction; a second wiring disposed between the substrate and the first wiring; a third wiring disposed between the substrate and the second wiring, the third wiring extending in the second direction; a fourth wiring disposed between the substrate and the third wiring; a fifth wiring disposed between the substrate and the fourth wiring, the fifth wiring extending in the second direction; a first memory cell connected to the first wiring and the second wiring; a second memory cell connected to the second wiring and the third wiring; a third memory cell connected to the third wiring and the fourth wiring; a fourth memory cell connected to the fourth wiring and the fifth wiring; a first contact electrode disposed between the first wiring and the fifth wiring, the first contact electrode extending in the first direction and being electrically connected to the first wiring and the fifth wiring; a second contact electrode disposed between the first contact electrode and the fifth wiring, the second contact electrode extending in the first direction and being electrically connected to the first wiring and the fifth wiring; and a third contact electrode disposed between the second contact electrode and the fifth wiring, the third contact electrode extending in the first direction and being electrically connected to the first wiring and the fifth wiring, wherein the second contact electrode has a width in the second direction larger than a width in the second direction of the first contact electrode and larger than a width in the second direction of the third contact electrode.

A semiconductor memory device according to one embodiment includes: a substrate; a first wiring disposed to be separated from the substrate in a first direction that intersects with a surface of the substrate, the first wiring extending in a second direction that intersects with the first direction; a second wiring disposed between the substrate and the first wiring; a third wiring disposed between the substrate and the second wiring, the third wiring extending in the second direction; a fourth wiring disposed between the substrate and the third wiring; a fifth wiring disposed between the substrate and the fourth wiring, the fifth wiring extending in the second direction; a first memory cell connected to the first wiring and the second wiring; a second memory cell connected to the second wiring and the third wiring; a third memory cell connected to the third wiring and the fourth wiring; a fourth memory cell connected to the fourth wiring and the fifth wiring; a sixth wiring disposed between the substrate and the fifth wiring; a first contact electrode disposed between the first wiring and the sixth wiring, the first contact electrode extending in the first direction and being electrically connected to the first wiring and the sixth wiring; a second contact electrode disposed between the first contact electrode and the sixth wiring, the second contact electrode extending in the first direction and being electrically connected to the first wiring and the sixth wiring; and a third contact electrode disposed between the fifth wiring and the sixth wiring, the third contact electrode extending in the first direction and being electrically connected to the fifth wiring and the sixth wiring, wherein the second contact electrode has a width in the second direction larger than a width in the second direction of the first contact electrode.

Next, semiconductor memory devices according to embodiments are described in detail with reference to the accompanying drawings. The following embodiments are only examples, and are not described for the purpose of limiting the present invention.

In this specification, a predetermined direction parallel to a surface of a substrate is referred to as an X-direction, a direction parallel to the surface of the substrate and perpendicular to the X-direction is referred to as a Y-direction, and a direction perpendicular to the surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined surface may be referred to as a third direction. These first direction, second direction, and third direction may correspond to any of the X-direction, the Y-direction, and the Z-direction and need not to correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end of a certain configuration mean a surface and an end portion on a side opposite to the substrate of this configuration. A surface intersecting with the X-direction or the Y-direction is referred to as aside surface and the like.

Circuit configurations of the semiconductor memory devices according to the embodiments will be described with reference to the drawings. Note that the following drawings are schematic, and the configurations are partially omitted in some cases for sake of convenience of the description.

First Embodiment

[Circuit Configuration]

Figure 2:
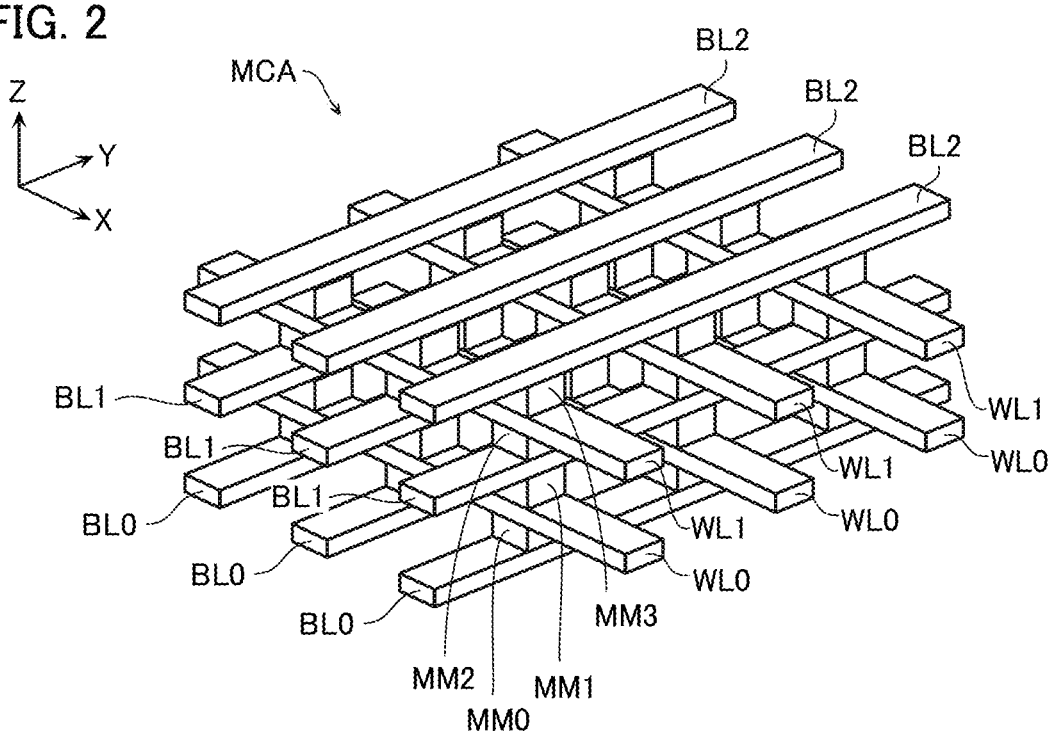
FIG. 2 is a schematic perspective view illustrating apart of the configuration of the semiconductor memory device.

First, with reference to FIG. 1 and FIG. 2, the circuit configuration of the semiconductor memory device according to the first embodiment will be described. FIG. 1 is a schematic circuit diagram illustrating apart of the configuration of the semiconductor memory device. FIG. 2 is a schematic perspective view illustrating a part of the configuration of the semiconductor memory device.

The semiconductor memory device according to the embodiment includes a memory cell array MCA and a peripheral circuit PC controlling the memory cell array MCA.

For example, as illustrated in FIG. 2, the memory cell array MCA includes memory mats MM0 to MM3 arranged in the Z-direction.

The memory mat MM0 includes a plurality of bit lines BL0 arranged in the X-direction and extending in the Y-direction, a plurality of word lines WL0 arranged in the Y-direction and extending in the X-direction, and a plurality of memory cells MC arranged in the X-direction and the Y-direction corresponding to the bit lines BL0 and the word lines WL0.

The memory mat MM1 includes a plurality of word line WL0 arranged in the Y-direction and extending in the X-direction, a plurality of bit lines BL1 arranged in the X-direction and extending in the Y-direction, and a plurality of memory cells MC arranged in the X-direction and the Y-direction corresponding to the word lines WL0 and the bit lines BL1.

The memory mat MM2 includes the plurality of bit lines BL1 arranged in the X-direction and extending in the Y-direction, a plurality of word lines WL1 arranged in the Y-direction and extending in the X-direction, and a plurality of memory cells MC arranged in the X-direction and the Y-direction corresponding to the bit lines BL1 and the word lines WL1.

The memory mat MM3 includes a plurality of word lines WL1 arranged in the Y-direction and extending in the X-direction, a plurality of bit lines BL2 arranged in the X-direction and extending in the Y-direction, and a plurality of memory cells MC arranged in the X-direction and the Y-direction corresponding to the word lines WL1 and the bit lines BL2.

For example, as illustrated in FIG. 1, the memory cell MC includes a cathode $E_C$, an anode $E_A$, a variable resistance element VR, and a nonlinear device NO. The cathode $E_C$ is connected to any of the bit lines BL0, BL1, and BL2. The anode $E_A$ is connected to any of the word lines WL0 and WL1.

The bit lines BL0, BL2 are commonly connected to bit line contacts BLC0, and connected to the peripheral circuit PC via the bit line contacts BLC0. The bit lines BL1 are connected to bit line contacts BLC1, and connected to the peripheral circuit PC via the bit line contacts BLC1.

The word lines WL0 are connected to word line contacts WLC0, and connected to the peripheral circuit PC via the word line contacts WLC0. The word lines WL1 are connected to word line contacts WLC1, and connected to the peripheral circuit PC via the word line contacts WLC1.

The peripheral circuit PC includes, for example, a step down circuit, a selection circuit, a sense amplifier circuit, and a sequencer that controls them. The step down circuit steps down a power supply voltage and the like to output it to a voltage supply line. The selection circuit electrically conducts the bit lines BL0, BL1, and BL2 and the word lines WL0, WL1 corresponding to selected addresses with corresponding voltage supply lines. The sense amplifier circuit outputs data of 0 or 1 corresponding to the voltages or the currents of the bit lines BL0, BL1, and BL2.

[Structure]

Next, with reference to FIG. 3 to FIG. 12C, the structure of the semiconductor memory device according to the embodiment will be described.

Figure 3:
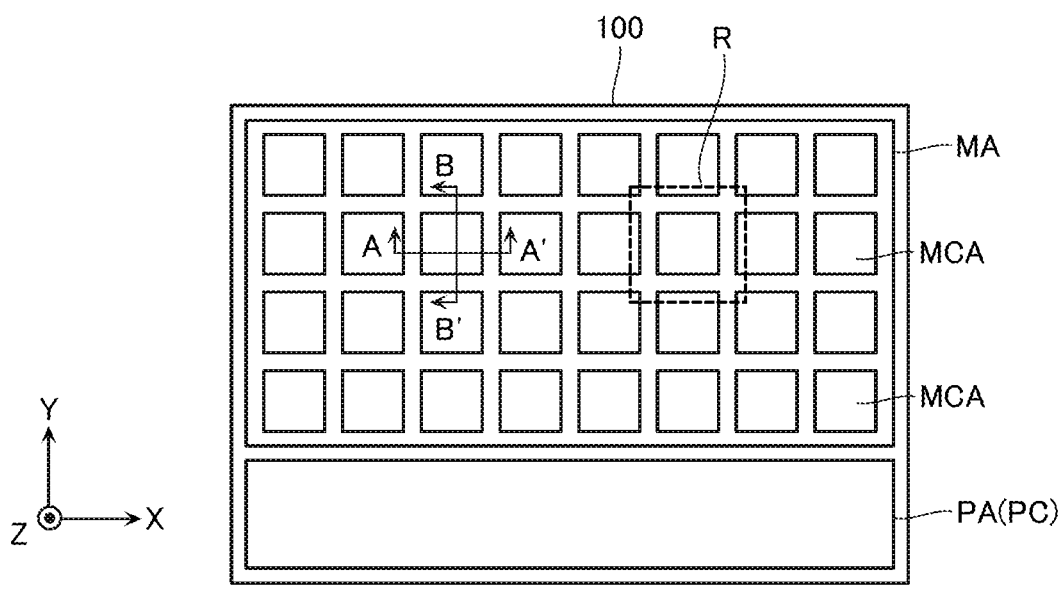
FIG. 3 is a schematic plan view illustrating a part of the configuration of the semiconductor memory device.
Figure 4:
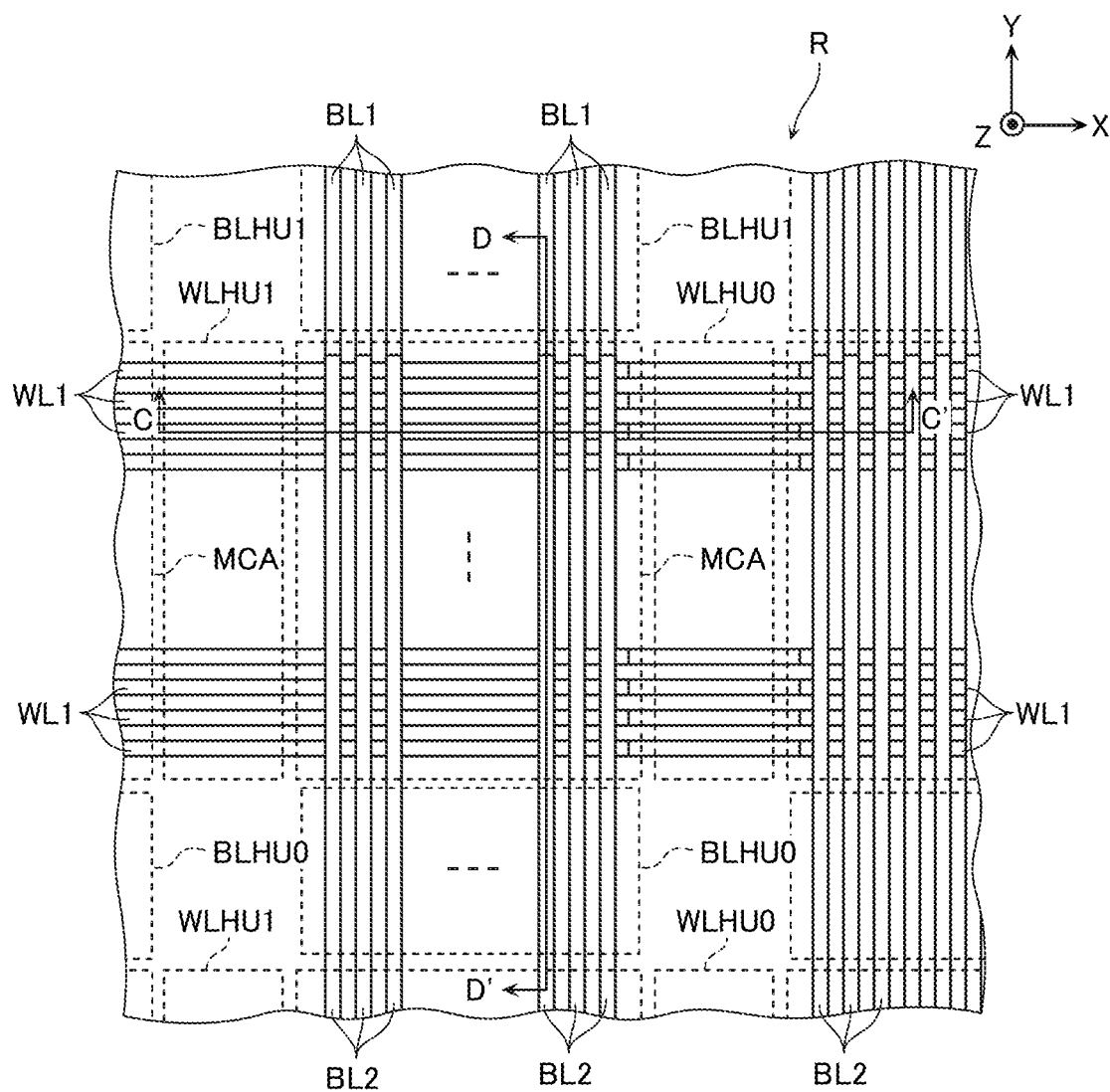
FIG. 4 is a schematic enlarged view of a part indicated by R in FIG. 3.
Figure 5:
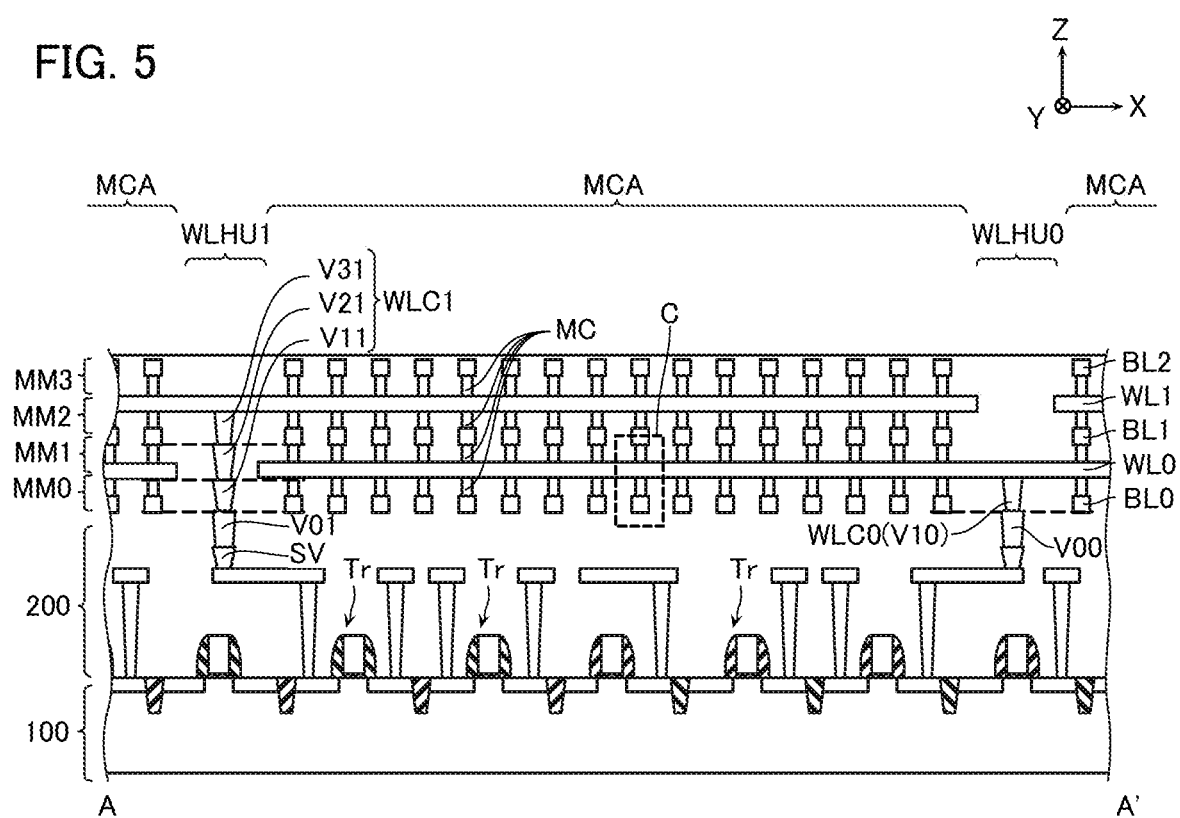
FIG. 5 is a schematic cross-sectional view of a structure illustrated in FIG. 3 taken along a line A-A' viewed in an arrow direction.
Figure 6:
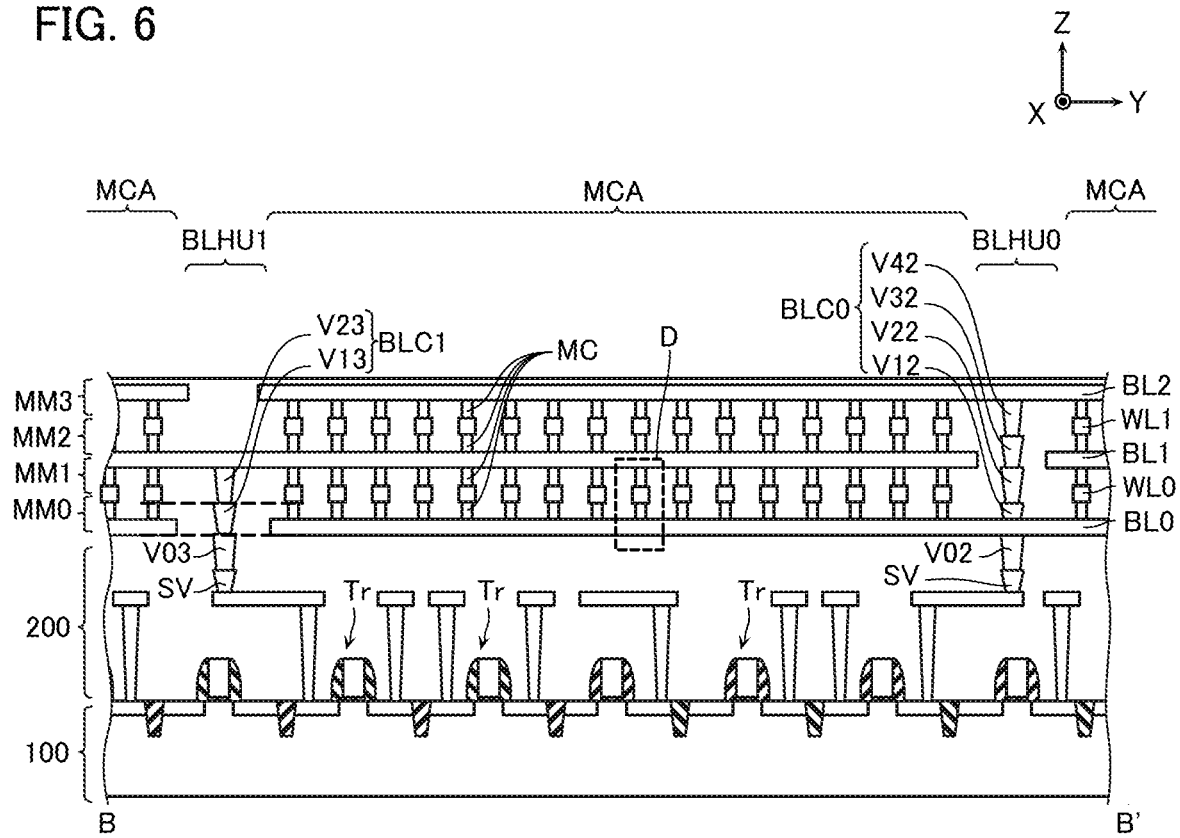
FIG. 6 is a schematic cross-sectional view of the structure illustrated in FIG. 3 taken along a line B-B' viewed in an arrow direction.

FIG. 3 is a schematic plan view illustrating the configuration of the semiconductor memory device according to the embodiment. FIG. 4 is a schematic enlarged view of a part indicated by R in FIG. 3. FIG. 5 is a schematic cross-sectional view of a structure illustrated in FIG. 3 taken along a line A-A' viewed in an arrow direction. FIG. 6 is a schematic cross-sectional view of the structure illustrated in FIG. 3 taken along a line B-B' viewed in an arrow direction.

As illustrated in FIG. 3, the semiconductor memory device according to the embodiment includes a substrate 100. The substrate 100 is a semiconductor substrate of silicon (Si) and the like. The substrate 100 includes a memory area MA and a peripheral area PA. As illustrated in FIG. 5 and FIG. 6, a circuit layer 200 is disposed on a surface of the substrate 100. The circuit layer 200 includes a plurality of transistors Tr and wirings constituting a part of the peripheral circuit PC. Memory cell arrays MCA are disposed above the circuit layer 200. As illustrated in FIG. 3, the memory cell arrays MCA are arranged in the X-direction and the Y-direction in a matrix. As illustrated in FIG. 4, a bit line hook-up region BLHU0 or a bit line hook-up region BLHU1 is disposed between the two memory cell arrays MCA mutually adjacent in the Y-direction. A word line hook-up region WLHU0 or a word line hook-up region WLHU1 is disposed between the two memory cell arrays MCA mutually adjacent in the X-direction.

[Configuration of Memory Mat MM0]

Figure 7A:
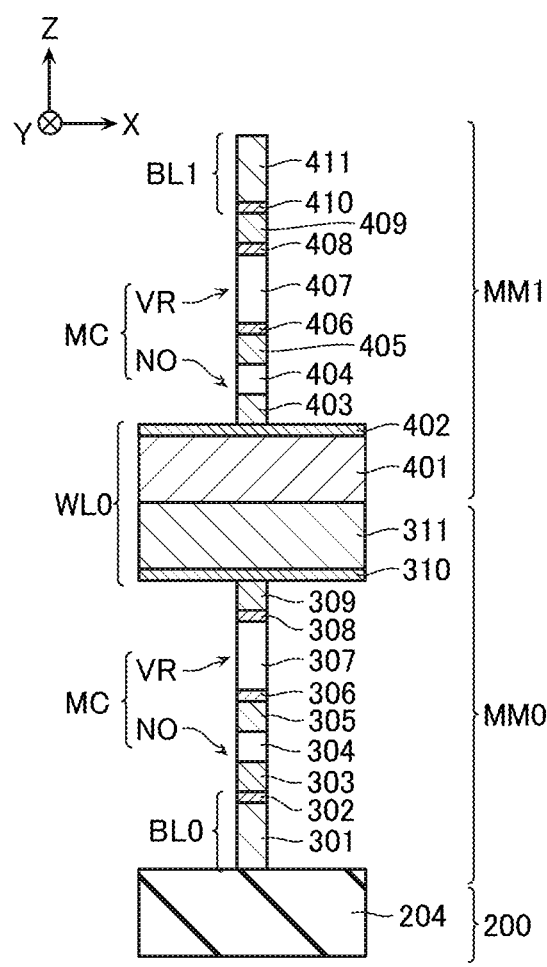
FIGS. 7A and 7B are schematic cross-sectional views corresponding to parts of FIG. 5 and FIG. 6.
Figure 7B:
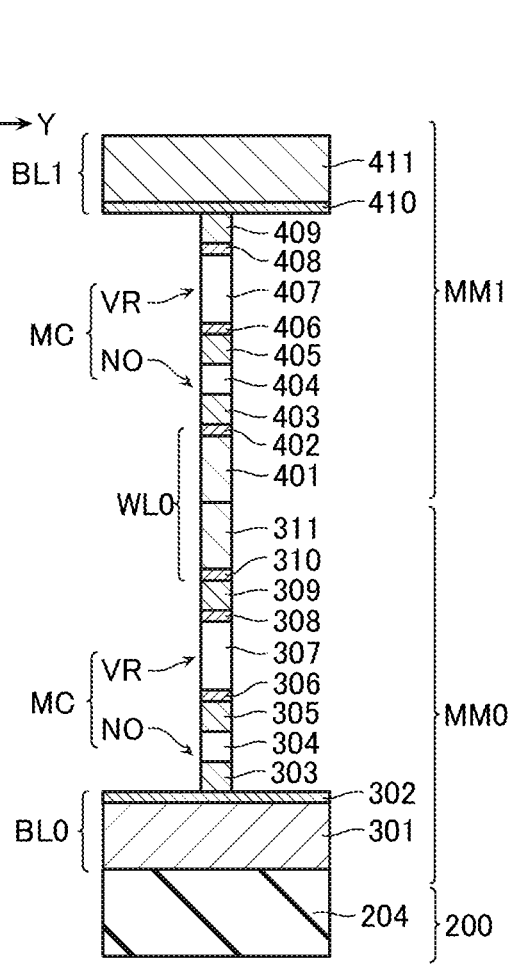

FIG. 7A is a schematic enlarged view corresponding to a part indicated by C in FIG. 5. FIG. 7B is a schematic enlarged view corresponding to a part indicated by D in FIG. 6.

As illustrated in FIG. 7A and FIG. 7B, the memory mat MM0 includes a conductive layer 301, a barrier conductive layer 302, an electrode layer 303, a chalcogen layer 304, an electrode layer 305, a barrier conductive layer 306, a chalcogen layer 307, a barrier conductive layer 308, an electrode layer 309, a barrier conductive layer 310, and a conductive layer 311.

The conductive layer 301 is disposed on an upper surface of an insulating layer 204 disposed to the circuit layer 200. The conductive layer 301 extends in the Y-direction, and functions as a part of the bit line BL0. The conductive layer 301 contains tungsten (W) or the like.

The barrier conductive layer 302 is disposed on an upper surface of the conductive layer 301. The barrier conductive layer 302 extends in the Y-direction, and functions as a part of the bit line BL0. The barrier conductive layer 302 contains tungsten nitride (WN) or the like.

The electrode layer 303 is disposed on an upper surface of the barrier conductive layer 302. The electrode layer 303 functions as the cathode $E_C$ of the memory cell MC. The electrode layer 303 contains carbon nitride (CN) or the like.

The chalcogen layer 304 is disposed on an upper surface of the electrode layer 303. The chalcogen layer 304 functions as the nonlinear device NO. For example, when a voltage lower than a predetermined threshold is applied to the chalcogen layer 304, the chalcogen layer 304 is a high resistance state. When the voltage applied to the chalcogen layer 304 reaches the predetermined threshold, the chalcogen layer 304 becomes a low resistance state, and a current flowing through the chalcogen layer 304 increases by multiple orders of magnitude. When the voltage applied to the chalcogen layer 304 is below the predetermined voltage for a certain period, the chalcogen layer 304 becomes the high resistance state again.

The chalcogen layer 304 contains, for example, at least one kind or more of chalcogen. The chalcogen layer 304 may contain, for example, a chalcogenide that is a compound containing chalcogen. The chalcogen layer 304 may contain at least one kind of element selected from the group consisting of B, Al, Ga, In, C, Si, Ge, Sn, As, P, and Sb.

Note that, the chalcogen here is one other than oxygen (O) among elements belonging to group 16 of the periodic table. The chalcogen includes sulfur (S), selenium (Se), tellurium (Te), and the like.

The electrode layer 305 is disposed on an upper surface of the chalcogen layer 304. The electrode layer 305 functions as an electrode connected to the variable resistance element VR and the nonlinear device NO. The electrode layer 305 contains carbon (C) or the like.

The barrier conductive layer 306 is disposed on an upper surface of the electrode layer 305. The barrier conductive layer 306 contains tungsten nitride (WN) or the like.

The chalcogen layer 307 is disposed on an upper surface of the barrier conductive layer 306. The chalcogen layer 307 functions as the variable resistance element VR. The chalcogen layer 307 includes, for example, a crystalline region and a phase change region. The phase change region is disposed on the cathode side with respect to the crystalline region. The phase change region becomes an amorphous state (reset state: high resistance state) by a heating to a melting temperature or more and a rapid cooling. The phase change region becomes a crystalline state (setting state: low resistance state) by a heating at a temperature lower than the melting temperature and higher than a crystallization temperature and a slow cooling.

The chalcogen layer 307 contains, for example, at least one kind or more of chalcogen. The chalcogen layer 307 may contain, for example, a chalcogenide that is a compound containing chalcogen. The chalcogen layer 307 may be GeSbTe, GeTe, SbTe, SiTe, or the like. The chalcogen layer 307 may contain at least one kind of element selected from germanium (Ge), antimony (Sb), and tellurium (Te).

The barrier conductive layer 308 is disposed on an upper surface of the chalcogen layer 307. The barrier conductive layer 308 contains tungsten nitride (WN) or the like.

The electrode layer 309 is disposed on an upper surface of the barrier conductive layer 308. The electrode layer 309 functions as the anode $E_A$ of the memory cell MC. The electrode layer 309 contains carbon (C) or the like.

The barrier conductive layer 310 is disposed on an upper surface of the electrode layer 309. The barrier conductive layer 310 extends in the X-direction, and functions as a part of the word line WL0. The barrier conductive layer 310 contains tungsten nitride (WN) or the like.

The conductive layer 311 is disposed on an upper surface of the barrier conductive layer 310. The conductive layer 311 extends in the X-direction, and functions as a part of the word line WL0. The conductive layer 311 contains tungsten (W) or the like.

[Configuration of Memory Mat MM1]

The memory mat MM1 includes a conductive layer 401, a barrier conductive layer 402, an electrode layer 403, a chalcogen layer 404, an electrode layer 405, a barrier conductive layer 406, a chalcogen layer 407, a barrier conductive layer 408, an electrode layer 409, a barrier conductive layer 410, and a conductive layer 411.

The conductive layer 401 is disposed on an upper surface of the conductive layer 311 in the memory mat MM0. The conductive layer 401 extends in the X-direction, and functions as a part of the word line WL0. The conductive layer 401 contains tungsten (W) or the like.

The barrier conductive layer 402 is disposed on an upper surface of the conductive layer 401. The barrier conductive layer 402 extends in the X-direction, and functions as a part of the word line WL0. The barrier conductive layer 402 contains tungsten nitride (WN) or the like.

The electrode layer 403 is disposed on an upper surface of the barrier conductive layer 402. The electrode layer 403 functions as the anode $E_A$ of the memory cell MC. The electrode layer 403 contains carbon nitride (CN) or the like.

The chalcogen layer 404 is disposed on an upper surface of the electrode layer 403. The chalcogen layer 404 functions as the nonlinear device NO similarly to the chalcogen layer 304. The chalcogen layer 404 contains, for example, a material similar to that of the chalcogen layer 304.

The electrode layer 405 is disposed on an upper surface of the chalcogen layer 404. The electrode layer 405 functions as an electrode connected to the variable resistance element VR and the nonlinear device NO. The electrode layer 405 contains carbon (C) or the like.

The barrier conductive layer 406 is disposed on an upper surface of the electrode layer 405. The barrier conductive layer 406 contains tungsten nitride (WN) or the like.

The chalcogen layer 407 is disposed on an upper surface of the barrier conductive layer 406. The chalcogen layer 407 functions as the variable resistance element VR similarly to the chalcogen layer 307. The chalcogen layer 407 contains, for example, a material similar to that of the chalcogen layer 307.

The barrier conductive layer 408 is disposed on an upper surface of the chalcogen layer 407. The barrier conductive layer 408 contains tungsten nitride (WN) or the like.

The electrode layer 409 is disposed on an upper surface of the barrier conductive layer 408. The electrode layer 409 functions as the cathode $E_C$ of the memory cell MC. The electrode layer 409 contains carbon (C) or the like.

The barrier conductive layer 410 is disposed on an upper surface of the electrode layer 409. The barrier conductive layer 410 extends in the Y-direction, and functions as a part of the bit line BL1. The barrier conductive layer 410 contains tungsten nitride (WN) or the like.

The conductive layer 411 is disposed on an upper surface of the barrier conductive layer 410. The conductive layer 411 extends in the Y-direction, and functions as a part of the bit line BL1. The conductive layer 411 contains tungsten (W) or the like.

[Configuration of Memory Mat MM2]

The memory mat MM2 is configured similarly to the memory mat MM0. Note that the conductive layer 301 in the memory mat MM2 is disposed on not the upper surface of the insulating layer 204 disposed to the circuit layer 200 but an upper surface of the conductive layer 411 in the memory mat MM1. The conductive layer 301 and the barrier conductive layer 302 in the memory mat MM2 function as a part of not the bit line BL0 but the bit line BL1. The barrier conductive layer 310 and the conductive layer 311 in the memory mat MM2 function as a part of not the word line WL0 but the word line WL1.

[Configuration of Memory Mat MM3]

The memory mat MM3 is configured similarly to the memory mat MM1. Note that the conductive layer 401 in the memory mat MM3 is disposed on not the upper surface of the conductive layer 311 in the memory mat MM0 but an upper surface of the conductive layer 311 in the memory mat MM2. The conductive layer 401 and the barrier conductive layer 402 in the memory mat MM3 function as a part of not the word line WL0 but the word line WL1. The barrier conductive layer 410 and the conductive layer 411 in the memory mat MM3 function as a part of not the bit line BL1 but the bit line BL2.

[Configuration of Word Line Hook-Up Region WLHU0]

Figure 8A:
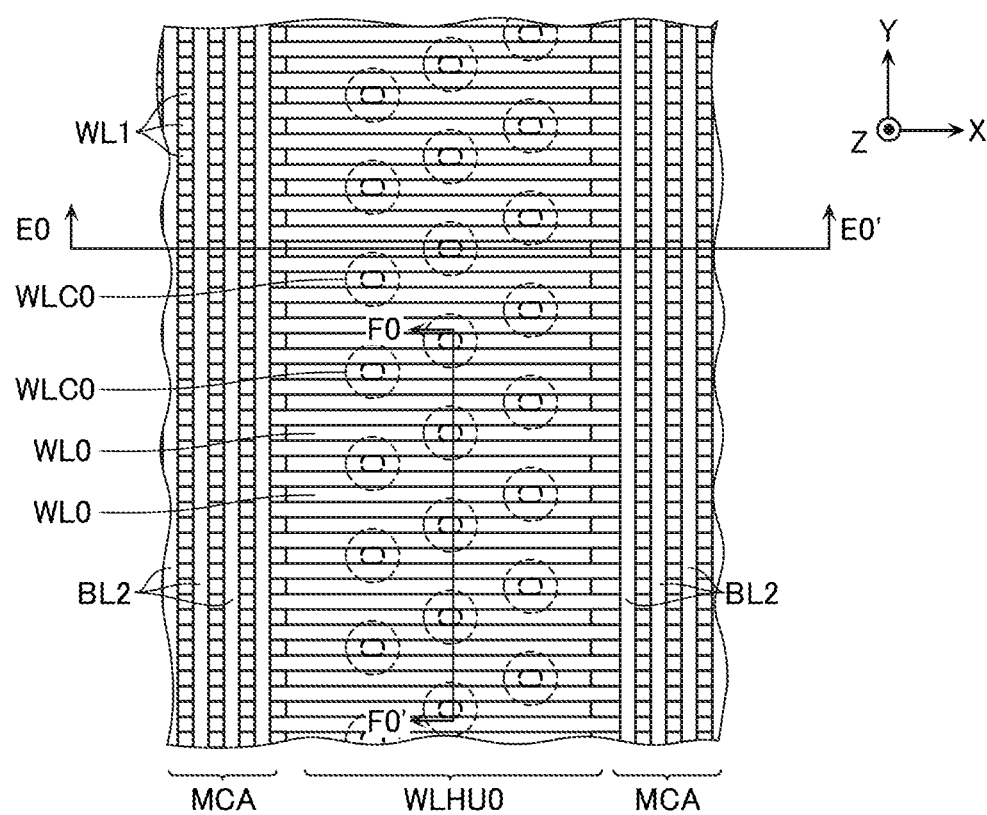
FIG. 8A is a schematic enlarged view corresponding to a part of FIG. 4.

As illustrated in FIG. 8A, the word line hook-up region WLHU0 includes a part of the plurality of word lines WL0 corresponding to the two memory cell arrays MCA mutually adjacent in the X-direction. The plurality of word lines WL0 extend in the X-direction and are arranged in the Y-direction.

As illustrated in FIG. 8A, the word line hook-up region WLHU0 includes a plurality of word line contacts WLC0 arranged in the X-direction and the Y-direction. As illustrated in FIG. 5, the plurality of word lines WL0 are connected to transistors Tr in the circuit layer 200 via the plurality of word line contacts WLC0. In the example of FIG. 8A, positions in the X-direction of the plurality of word line contacts WLC0 connected to a $3n_A$-th ($n_A$ is a natural number) word line WL0 counting from one side in the Y-direction, positions in the X-direction of the plurality of word line contacts WLC0 connected to a $3n_A+1$-th word line WL0, and positions in the X-direction of the plurality of word line contacts WLC0 connected to a $3n_A+2$-th word line WL0 are mutually different.

Figure 9A:
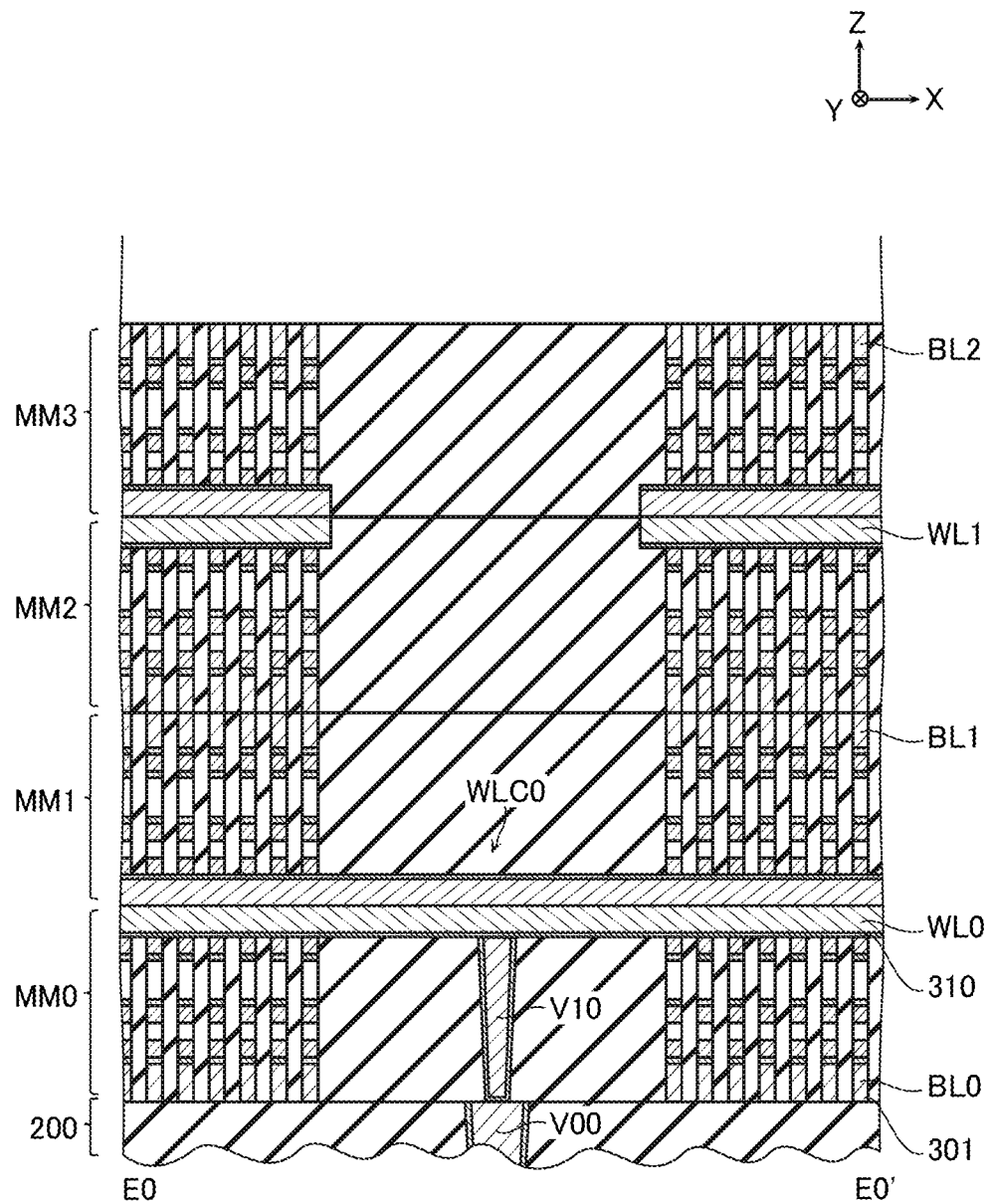
FIG. 9A is a schematic cross-sectional view of a structure illustrated in FIG. 8A taken along a line E0-E0' viewed in an arrow direction.
Figure 9B:
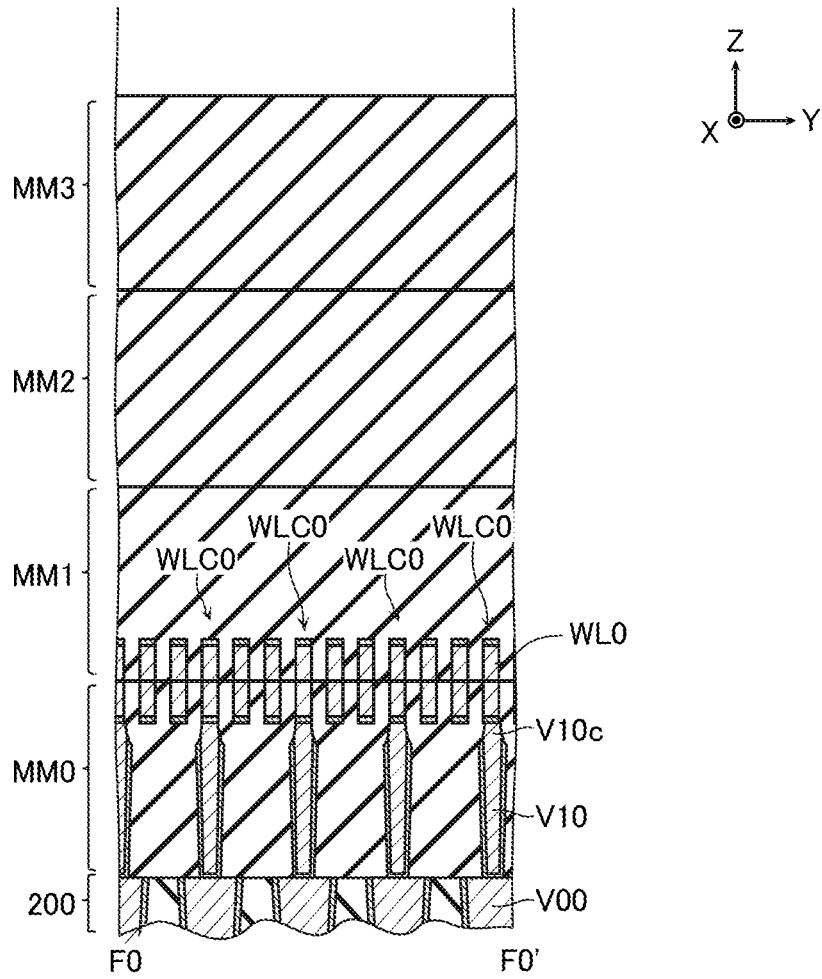
FIG. 9B is a schematic cross-sectional view of the structure illustrated in FIG. 8A taken along a line F0-F0' viewed in an arrow direction.

As illustrated in FIG. 9A, the word line contact WLC0 includes a contact electrode V00 disposed to the circuit layer 200 and a contact electrode V10 disposed at a height position corresponding to the memory mat MM0.

The contact electrode V00 includes, for example, a stacked film of a barrier conductive layer of titanium nitride or the like and a metal layer of tungsten or the like. The contact electrode V00 extends in the Z-direction, and is connected to the peripheral circuit PC via a contact electrode SV (FIG. 5) disposed downward. A height position of an upper surface of the contact electrode V00 matches a height position of a lower surface of the conductive layer 301 in the memory mat MM0.

The contact electrode V10 includes, for example, a stacked film of a barrier conductive layer of titanium nitride or the like and a metal layer of tungsten or the like. The contact electrode V10 extends in the Z-direction. A lower end of the contact electrode V10 is connected to the upper surface of the contact electrode V00. An upper end of the contact electrode V10 is connected to a lower surface of the barrier conductive layer 310 in the memory mat MM0. A height position of an upper surface of the contact electrode V10 matches a height position of the lower surface of the barrier conductive layer 310 in the memory mat MM0.

Figure 9C:
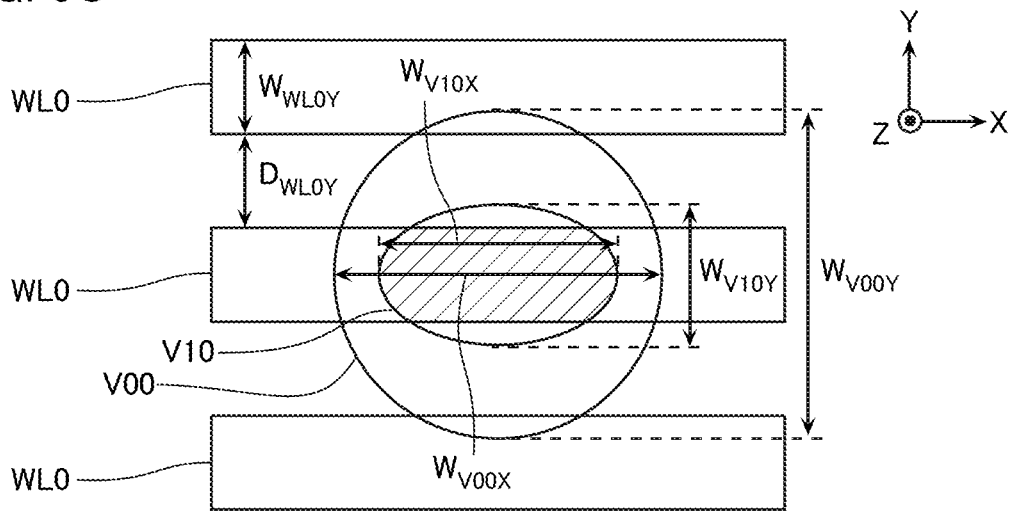
FIG. 9C is a schematic enlarged view corresponding to a part of FIG. 8A.

In FIG. 9C, a width in the Y-direction of the word line WL0 is defined as $W_{WL0Y}$, and a distance between the two word lines WL0 mutually adjacent in the Y-direction is defined as $D_{WL0Y}$. In the example of FIG. 9C, a width $W_{V00Y}$ in the Y-direction of the contact electrode V00 is larger than a sum of $W_{WL0Y}$ and $2D_{WL0Y}$. A width $W_{V10Y}$ in the Y-direction of the contact electrode V10 is larger than $W_{WL0Y}$ and smaller than the sum of $W_{WL0Y}$ and $2D_{WL0Y}$. For example, in the example of FIG. 9B, a width in the Y-direction of an upper end portion V10c of the contact electrode V10 matches the width ($W_{WL0Y}$ in FIG. 9C) in the Y-direction of the word line WL0. Note that the width in the Y-direction of the upper end portion V10c of the contact electrode V10 is smaller than the width ($W_{WL0Y}$ in FIG. 9C) in the Y-direction of the word line WL0 in some cases. In the example of FIG. 9C, a width $W_{V00X}$ in the X-direction of the contact electrode V00 is about the same as the width $W_{V00Y}$ in the Y-direction. A width $W_{V10X}$ in the X-direction of the contact electrode V10 is larger than the width $W_{V10Y}$ in the Y-direction of the contact electrode V10 and smaller than the width $W_{V00X}$ in the X-direction of the contact electrode V00.

[Configuration of Word Line Hook-Up Region WLHU1]

Figure 8B:
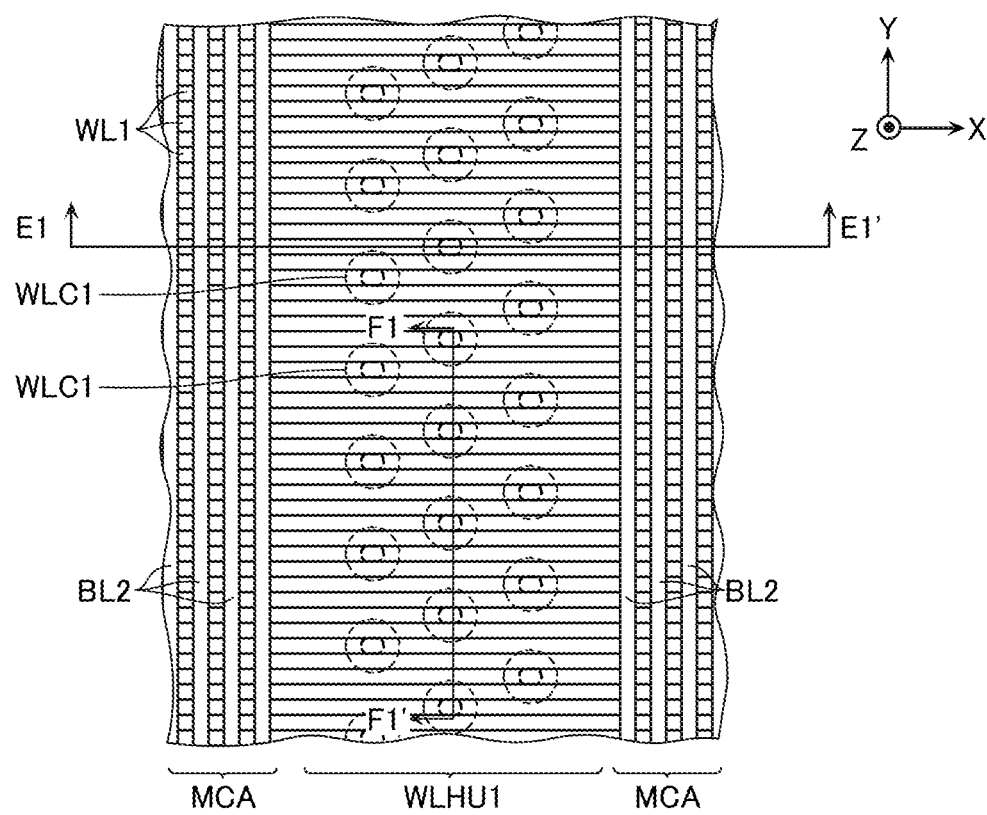
FIG. 8B is a schematic enlarged view corresponding to a part of FIG. 4.

As illustrated in FIG. 8B, the word line hook-up region WLHU1 includes a part of the plurality of word lines WL1 corresponding to the two memory cell arrays MCA mutually adjacent in the X-direction. The plurality of word lines WL1 extend in the X-direction and are arranged in the Y-direction.

As illustrated in FIG. 8B, the word line hook-up region WLHU1 includes a plurality of word line contacts WLC1 arranged in the X-direction and the Y-direction. As illustrated in FIG. 5, the plurality of word lines WL1 are connected to the transistors Tr in the circuit layer 200 via the plurality of word line contacts WLC1. In the example of FIG. 8B, positions in the X-direction of the plurality of word line contacts WLC1 connected to a $3n_B$-th ($n_B$ is a natural number) word line WL1 counting from one side in the Y-direction, positions in the X-direction of the plurality of word line contacts WLC1 connected to a $3n_B+1$-th word line WL1, and positions in the X-direction of the plurality of word line contacts WLC1 connected to a $3n_B+2$-th word line WL1 are mutually different.

Figure 10A:
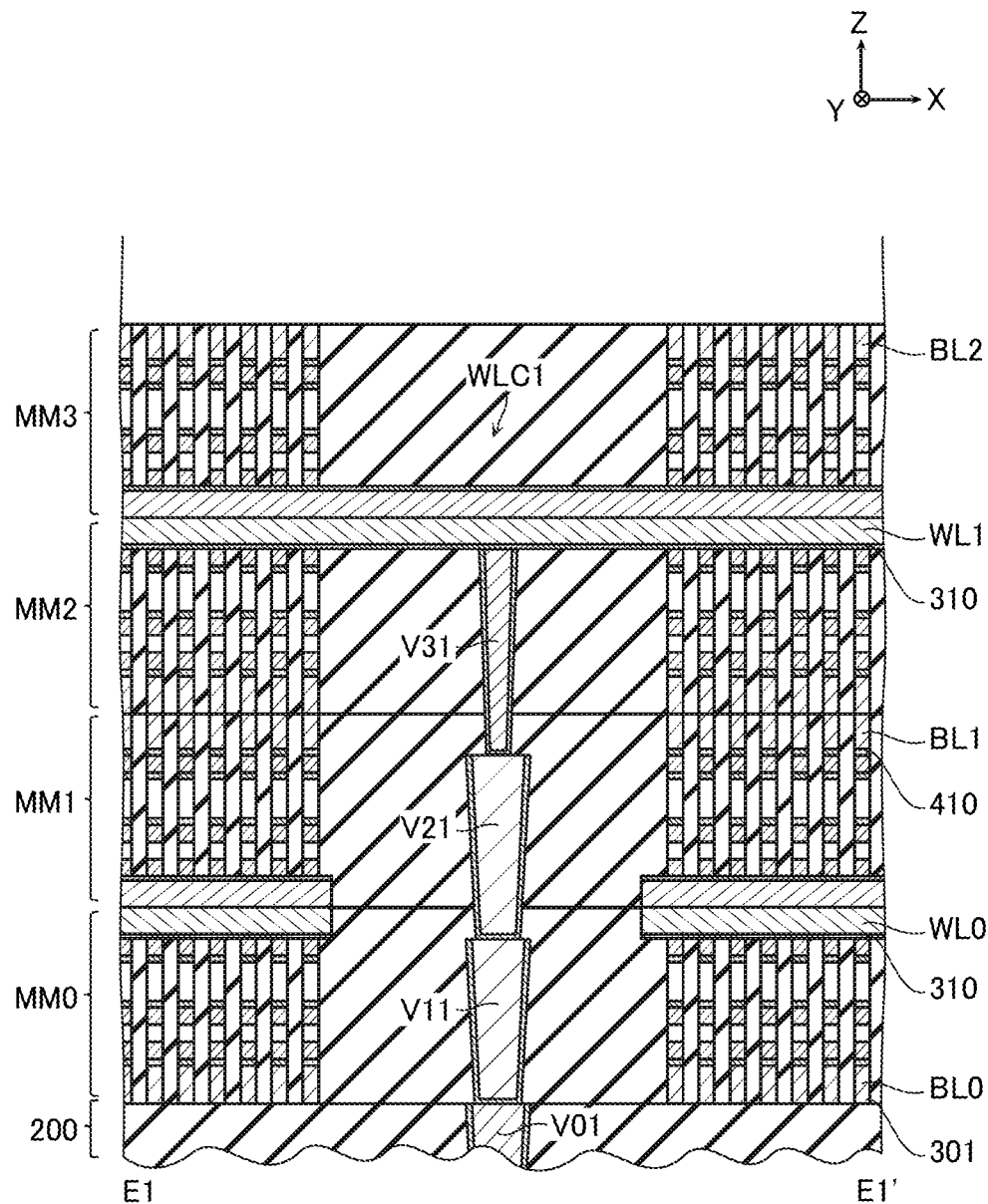
FIG. 10A is a schematic cross-sectional view of a structure illustrated in FIG. 8B taken along a line E1-E1' viewed in an arrow direction.
Figure 10B:
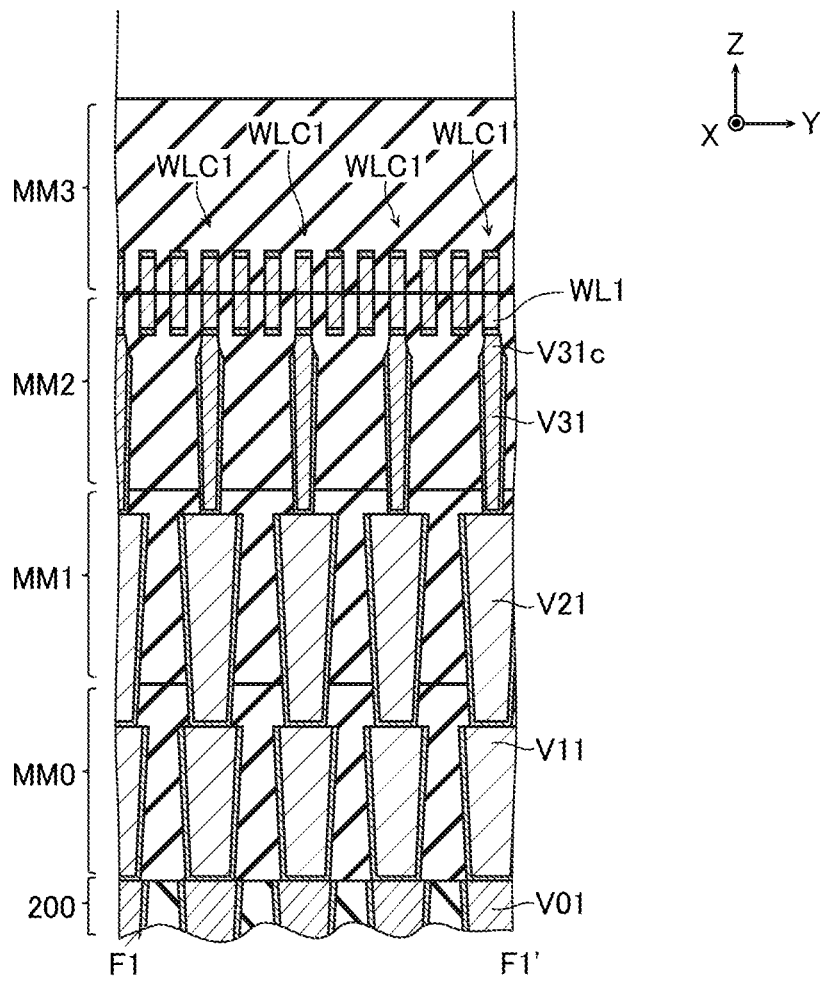
FIG. 10B is a schematic cross-sectional view of the structure illustrated in FIG. 8B taken along a line F1-F1' viewed in an arrow direction.

As illustrated in FIG. 10A, the word line contact WLC1 includes a contact electrode V01 disposed to the circuit layer 200, a contact electrode V11 disposed at a height position corresponding to the memory mat MM0, a contact electrode V21 disposed at a height position corresponding to the memory mat MM1, and a contact electrode V31 disposed at a height position corresponding to the memory mat MM2.

The contact electrode V01 includes, for example, a stacked film of a barrier conductive layer of titanium nitride or the like and a metal layer of tungsten or the like. The contact electrode V01 extends in the Z-direction, and is connected to the peripheral circuit PC via the contact electrode SV (FIG. 5) disposed downward. A height position of an upper surface of the contact electrode V01 matches the height position of the lower surface of the conductive layer 301 in the memory mat MM0.

The contact electrode V11 includes, for example, a stacked film of a barrier conductive layer of titanium nitride or the like and a metal layer of tungsten or the like. The contact electrode V11 extends in the Z-direction. A lower end of the contact electrode V11 is connected to the upper surface of the contact electrode V01. A height position of an upper surface of the contact electrode V11 matches the height position of the lower surface of the barrier conductive layer 310 in the memory mat MM0.

The contact electrode V21 includes, for example, a stacked film of a barrier conductive layer of titanium nitride or the like and a metal layer of tungsten or the like. The contact electrode V21 extends in the Z-direction. A lower end of the contact electrode V21 is connected to the upper surface of the contact electrode V11. A height position of an upper surface of the contact electrode V21 matches a height position of a lower surface of the barrier conductive layer 410 in the memory mat MM1.

The contact electrode V31 includes, for example, a stacked film of a barrier conductive layer of titanium nitride or the like and a metal layer of tungsten or the like. The contact electrode V31 extends in the Z-direction. A lower end of the contact electrode V31 is connected to the upper surface of the contact electrode V21. An upper end of the contact electrode V31 is connected to a lower surface of the barrier conductive layer 310 in the memory mat MM2. A height position of an upper surface of the contact electrode V31 matches a height position of the lower surface of the barrier conductive layer 310 in the memory mat MM2.

Figure 10C:
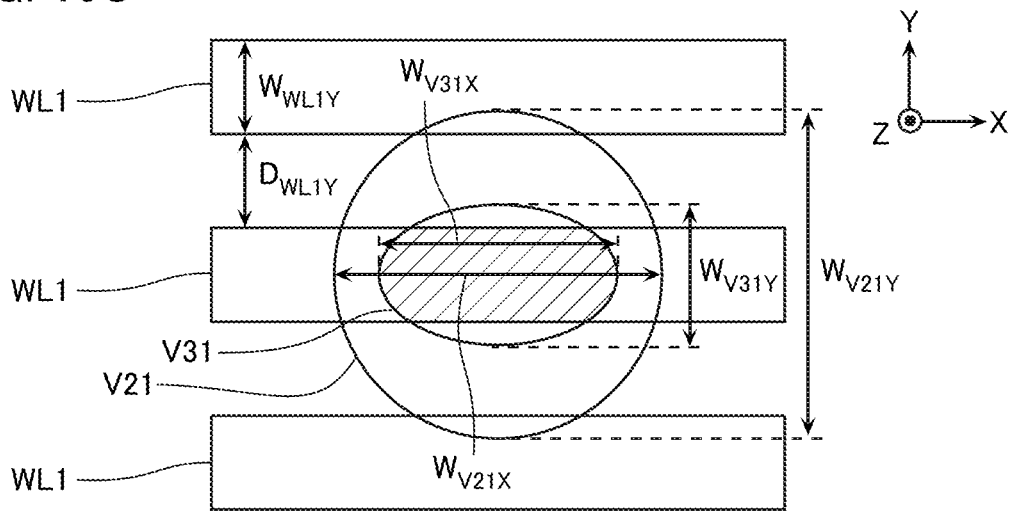
FIG. 10C is a schematic enlarged view corresponding to a part of FIG. 8B.

In FIG. 10C, a width in the Y-direction of the word line WL1 is defined as $W_{WL1Y}$, and a distance between the two word lines WL1 mutually adjacent in the Y-direction is defined as $D_{WL1Y}$. In the example of FIG. 10C, a width $W_{V21Y}$ in the Y-direction of the contact electrodes V01, V11, and V21 is larger than a sum of $W_{WL1Y}$ and $2D_{WL1Y}$. A width $W_{V31Y}$ in the Y-direction of the contact electrode V31 is larger than $W_{WL1Y}$ and smaller than the sum of $W_{WL1Y}$ and $2D_{WL1Y}$. For example, in the example of FIG. 10B, a width in the Y-direction of an upper end portion V31c of the contact electrode V31 matches the width ($W_{WL1Y}$ in FIG. 10C) in the Y-direction of the word line WL1. Note that the width in the Y-direction of the upper end portion V31c of the contact electrode V31 is smaller than the width ($W_{WL1Y}$ in FIG. 10C) in the Y-direction of the word line WL1 in some cases. In the example of FIG. 10C, a width $W_{V21X}$ in the X-direction of the contact electrodes V01, V11, and V21 is about the same as the width $W_{V21Y}$ in the Y-direction. A width $W_{V31X}$ in the X-direction of the contact electrode V31 is larger than the width $W_{V31Y}$ in the Y-direction of the contact electrode V31 and smaller than the width $W_{V21X}$ in the X-direction of the contact electrodes V01, V11, and V21.

[Configuration of Bit Line Hook-Up Region BLHU0]

Figure 8C:
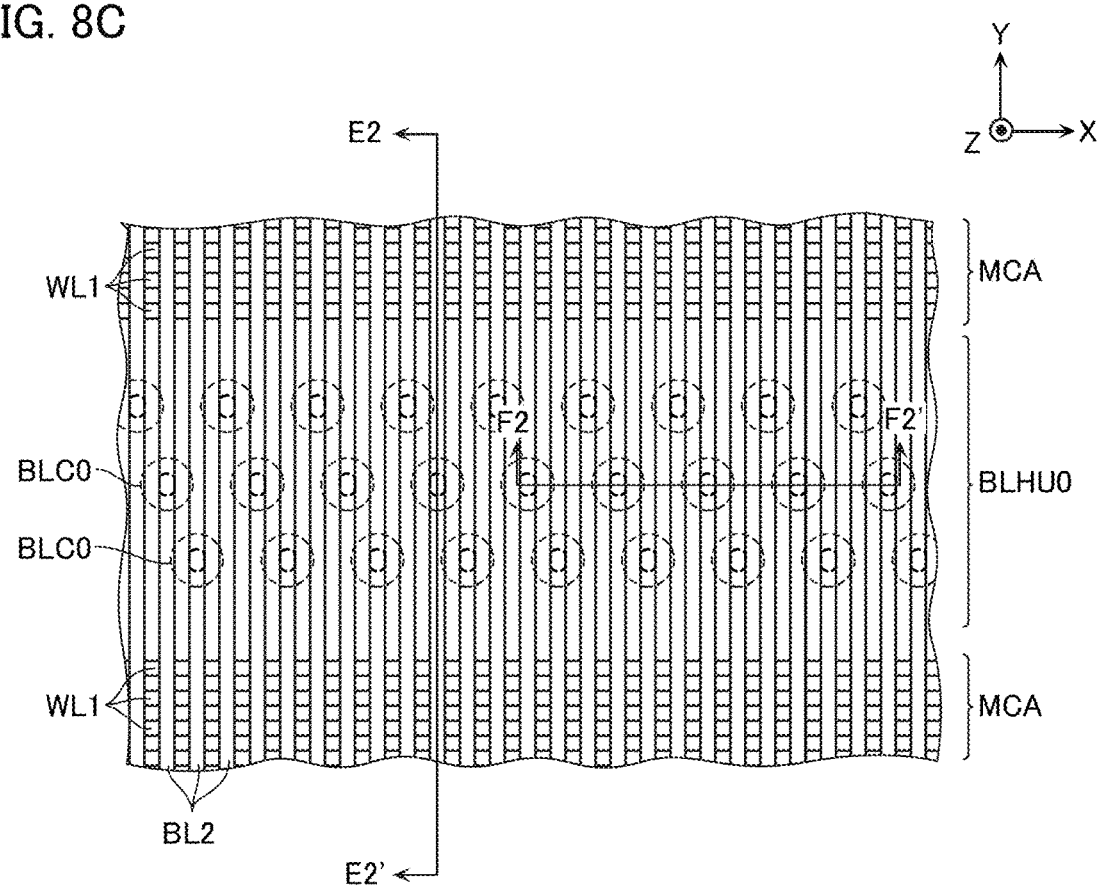
FIG. 8C is a schematic enlarged view corresponding to a part of FIG. 4.

As illustrated in FIG. 8C, the bit line hook-up region BLHU0 includes a part of a plurality of bit lines BL0, BL2 corresponding to the two memory cell arrays MCA mutually adjacent in the Y-direction. The plurality of bit lines BL0, BL2 extend in the Y-direction and are arranged in the X-direction.

As illustrated in FIG. 8C, the bit line hook-up region BLHU0 includes a plurality of bit line contacts BLC0 arranged in the X-direction and the Y-direction. As illustrated in FIG. 6, the plurality of bit lines BL0, BL2 are connected to the transistors Tr in the circuit layer 200 via the plurality of bit line contacts BLC0. In the example of FIG. 8C, positions in the Y-direction of the plurality of bit line contacts BLC0 connected to a $3n_C$-th ($n_C$ is a natural number) bit lines BL0, BL2 counting from one side in the X-direction, positions in the Y-direction of the plurality of bit line contacts BLC0 connected to a $3n_C+1$-th bit lines BL0, BL2, and positions in the Y-direction of the plurality of bit line contacts BLC0 connected to a $3n_C+2$-th bit lines BL0, BL2 are mutually different.

Figure 11A:
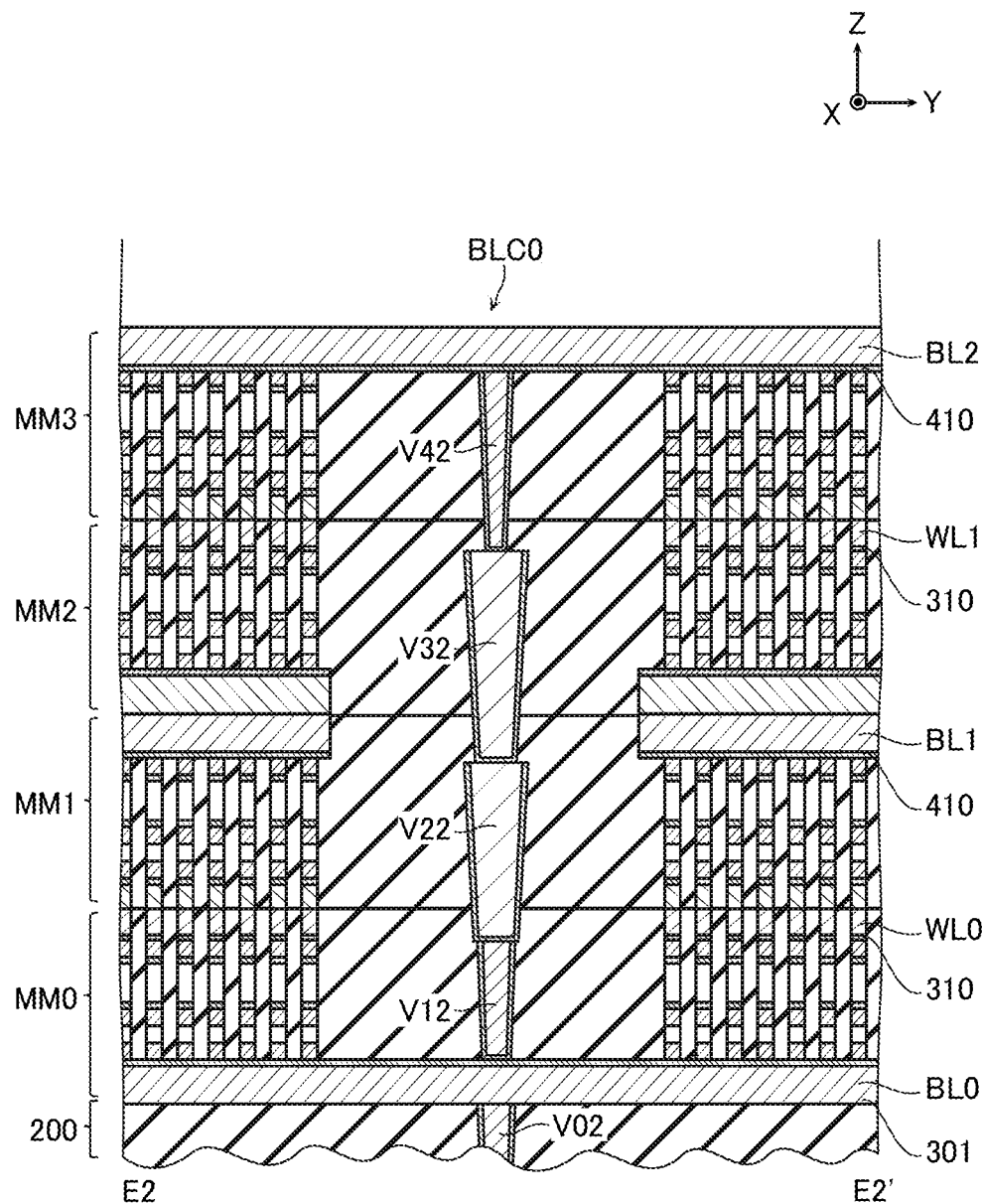
FIG. 11A is a schematic cross-sectional view of a structure illustrated in FIG. 8C taken along a line E2-E2' viewed in an arrow direction.
Figure 11B:
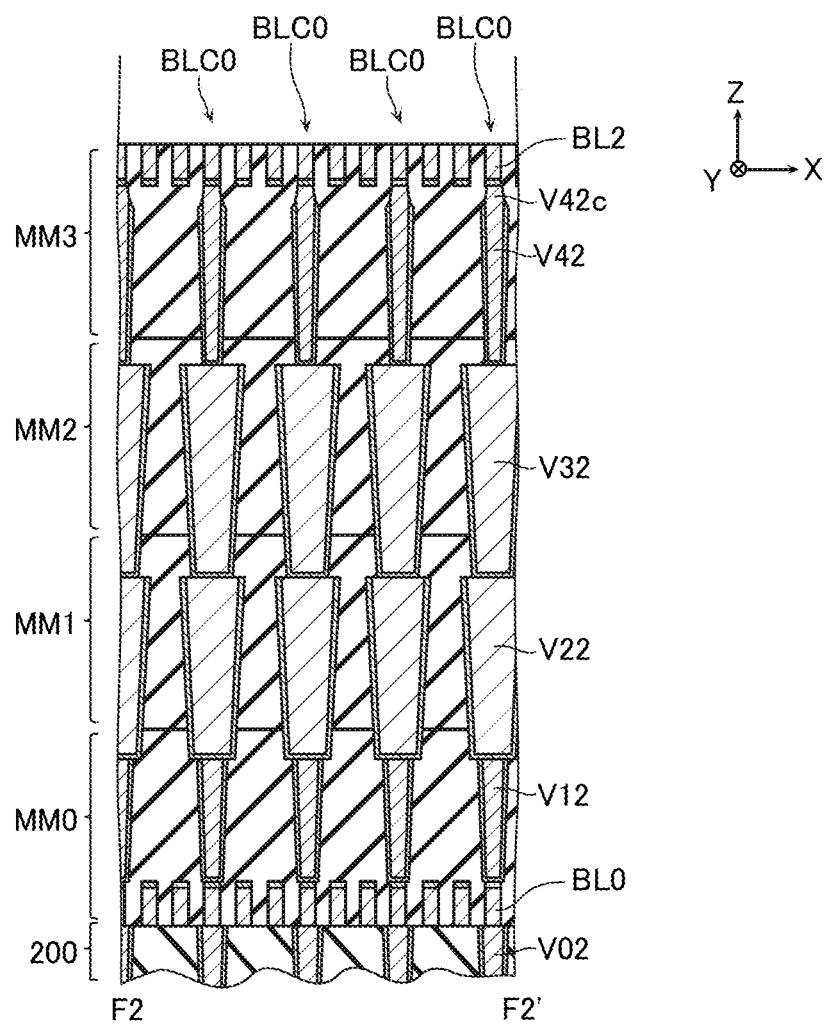
FIG. 11B is a schematic cross-sectional view of the structure illustrated in FIG. 8C taken along a line F2-F2' viewed in an arrow direction.

As illustrated in FIG. 11A, the bit line contact BLC0 includes a contact electrode V02 disposed to the circuit layer 200, a contact electrode V12 disposed at the height position corresponding to the memory mat MM0, a contact electrode V22 disposed at the height position corresponding to the memory mat MM1, a contact electrode V32 disposed at the height position corresponding to the memory mat MM2, and a contact electrode V42 disposed at a height position corresponding to the memory mat MM3.

The contact electrode V02 includes, for example, a stacked film of a barrier conductive layer of titanium nitride or the like and a metal layer of tungsten or the like. The contact electrode V02 extends in the Z-direction, and is connected to the peripheral circuit PC via the contact electrode SV (FIG. 6) disposed downward. An upper end of the contact electrode V02 is connected to the lower surface of the conductive layer 301 in the memory mat MM0. A height position of an upper surface of the contact electrode V02 matches the height position of the lower surface of the conductive layer 301 in the memory mat MM0.

The contact electrode V12 includes, for example, a stacked film of a barrier conductive layer of titanium nitride or the like and a metal layer of tungsten or the like. The contact electrode V12 extends in the Z-direction. A lower end of the contact electrode V12 is connected to the upper surface of the barrier conductive layer 302. A height position of an upper surface of the contact electrode V12 matches the height position of the lower surface of the barrier conductive layer 310 in the memory mat MM0.

The contact electrode V22 includes, for example, a stacked film of a barrier conductive layer of titanium nitride or the like and a metal layer of tungsten or the like. The contact electrode V22 extends in the Z-direction. A lower end of the contact electrode V22 is connected to the upper surface of the contact electrode V12. A height position of an upper surface of the contact electrode V22 matches the height position of the lower surface of the barrier conductive layer 410 in the memory mat MM1.

The contact electrode V32 includes, for example, a stacked film of a barrier conductive layer of titanium nitride or the like and a metal layer of tungsten or the like. The contact electrode V32 extends in the Z-direction. A lower end of the contact electrode V32 is connected to the upper surface of the contact electrode V22. A height position of an upper surface of the contact electrode V32 matches the height position of the lower surface of the barrier conductive layer 310 in the memory mat MM2.

The contact electrode V42 includes, for example, a stacked film of a barrier conductive layer of titanium nitride or the like and a metal layer of tungsten or the like. The contact electrode V42 extends in the Z-direction. A lower end of the contact electrode V42 is connected to the upper surface of the contact electrode V32. An upper end of the contact electrode V42 is connected to a lower surface of the barrier conductive layer 410 in the memory mat MM3. A height position of an upper surface of the contact electrode V42 matches a height position of the lower surface of the barrier conductive layer 410 in the memory mat MM3.

Figure 11C:
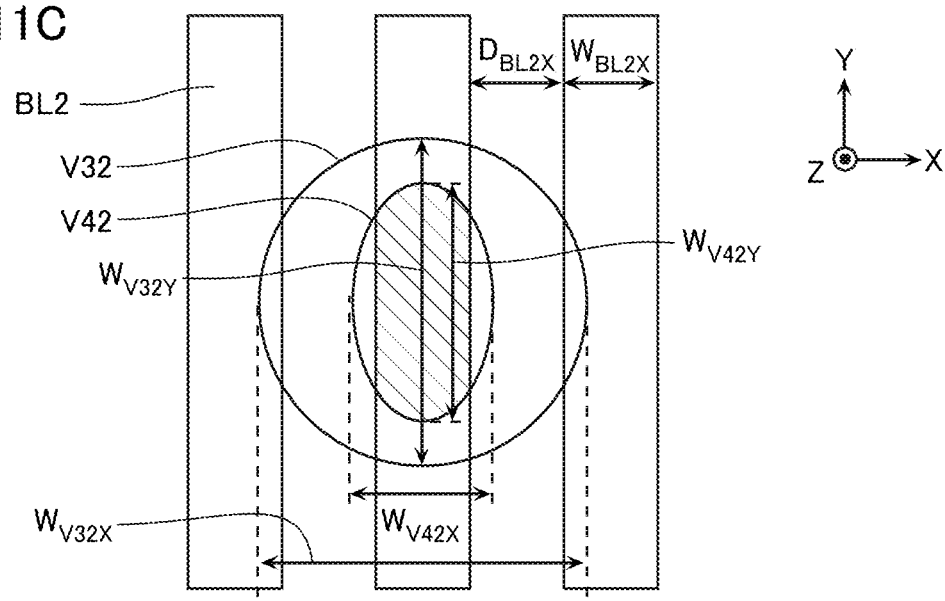
FIG. 11C is a schematic enlarged view corresponding to a part of FIG. 8C.

In FIG. 11C, widths in the X-direction of the bit lines BL0, BL2 are defined as $W_{BL2X}$, and distances between the two bit lines BL0, BL2 mutually adjacent in the X-direction are defined as $D_{BL2X}$. In the example of FIG. 11C, a width $W_{V32X}$ in the X-direction of the contact electrodes V22, V32 is larger than a sum of $W_{BL2X}$ and $2D_{BL2X}$. A Width $W_{V42X}$ in the X-direction of the contact electrodes V12, V42 is larger than $W_{BL2X}$ and smaller than the sum of $W_{BL2X}$ and $2D_{BL2X}$. For example, in the example of FIG. 11B, a width in the X-direction of an upper end portion V42c of the contact electrode V42 matches the width ($W_{BL2X}$ in FIG. 11C) in the X-direction of the bit lines BL0, BL2. Note that the width in the X-direction of the upper end portion V42c of the contact electrode V42 is smaller than the width ($W_{BL2X}$ in FIG. 11C) in the X-direction of the bit lines BL0, BL2 in some cases. In the example of FIG. 11C, a width $W_{V32Y}$ in the Y-direction of the contact electrodes V22, V32 is about the same as the width $W_{V32X}$ in the X-direction. A Width $W_{V42Y}$ in the Y-direction of the contact electrodes V12, V42 is larger than the width $W_{V42X}$ in the X-direction of the contact electrode V42 and smaller than the width $W_{V32Y}$ in the Y-direction of the contact electrodes V22, V32.

[Configuration of Bit Line Hook-Up Region BLHU1]

Figure 8D:
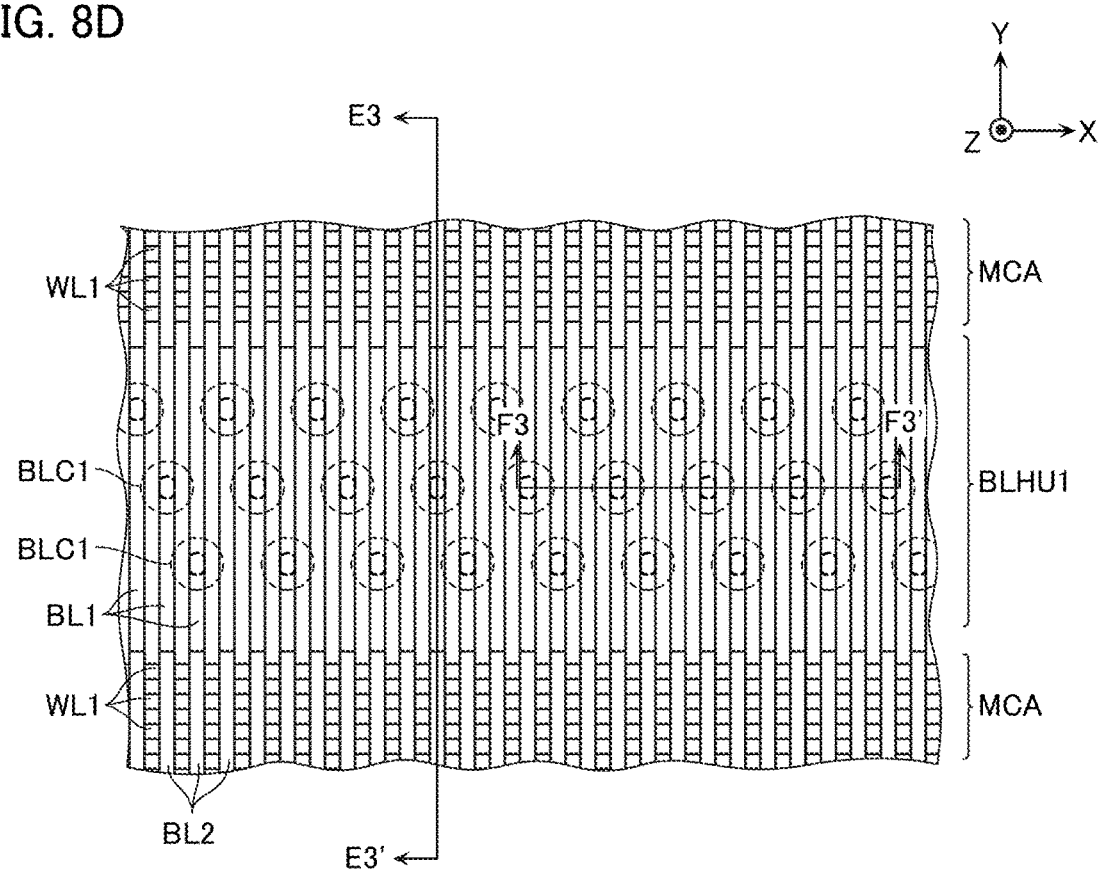
FIG. 8D is a schematic enlarged view corresponding to a part of FIG. 4.

As illustrated in FIG. 8D, the bit line hook-up region BLHU1 includes a part of the plurality of bit lines BL1 corresponding to the two memory cell arrays MCA mutually adjacent in the Y-direction. The plurality of bit lines BL1 extend in the Y-direction and are arranged in the X-direction.

As illustrated in FIG. 8D, the bit line hook-up region BLHU1 includes a plurality of bit line contacts BLC1 arranged in the X-direction and the Y-direction. As illustrated in FIG. 6, the plurality of bit lines BL1 are connected to the transistors Tr in the circuit layer 200 via the plurality of bit line contacts BLC1. In the example of FIG. 8D, positions in the Y-direction of the plurality of bit line contacts BLC1 connected to a $3n_D$-th ($n_D$ is a natural number) bit line BL1 counting from one side in the X-direction, positions in the Y-direction of the plurality of bit line contacts BLC1 connected to a $3n_D+1$-th bit line BL1, and positions in the Y-direction of the plurality of bit line contacts BLC1 connected to a $3n_D+2$-th bit line BL1 are mutually different.

Figure 12A:
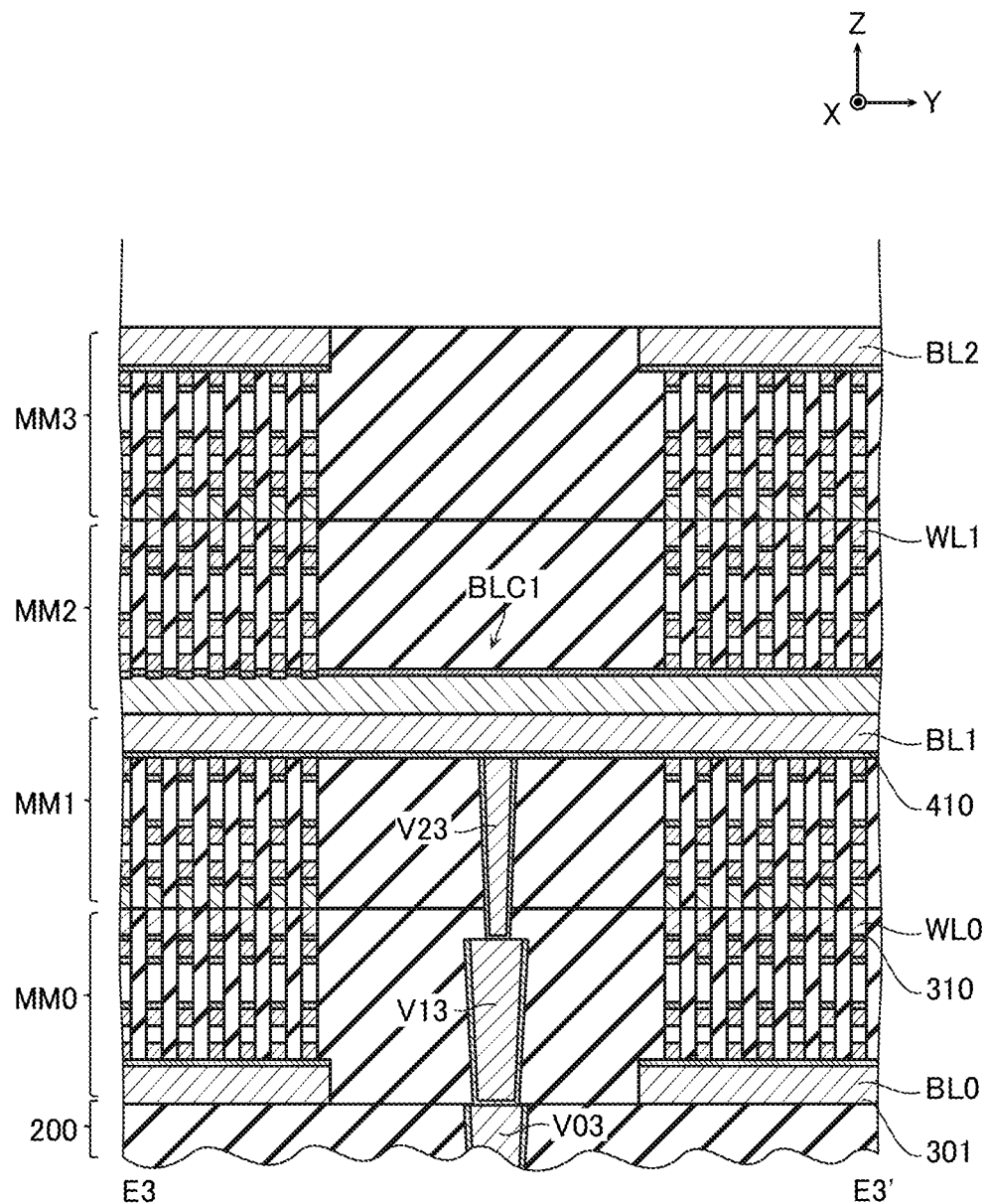
FIG. 12A is a schematic cross-sectional view of a structure illustrated in FIG. 8D taken along a line E3-E3' viewed in an arrow direction.
Figure 12B:
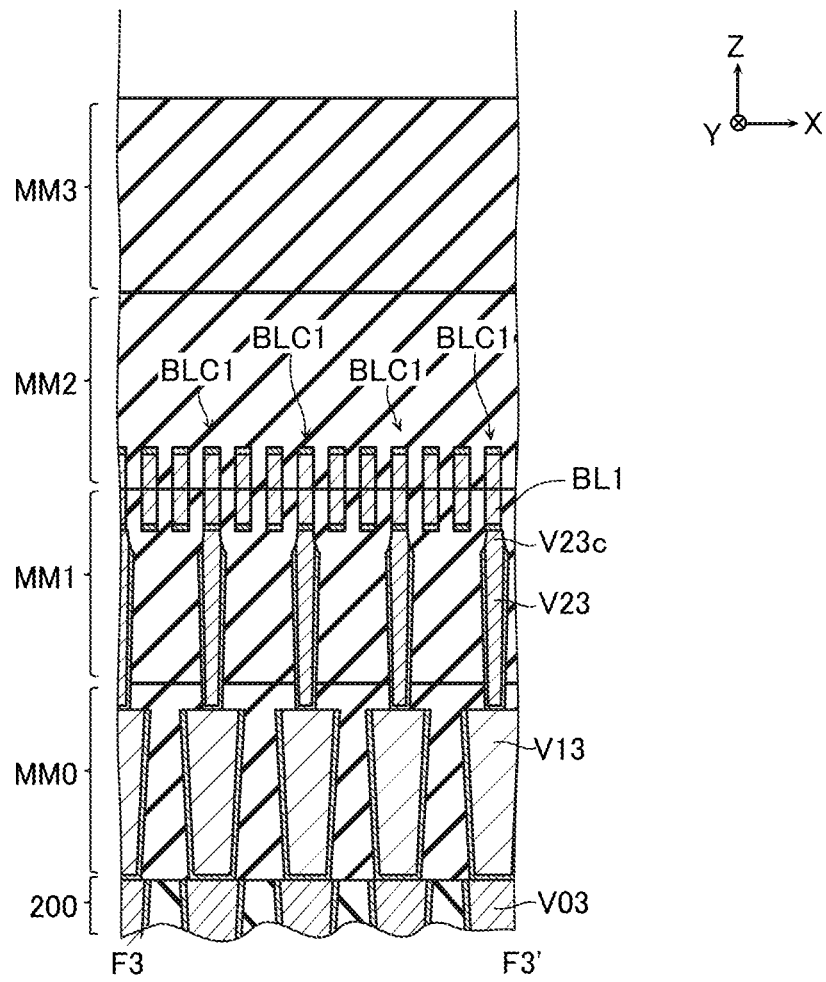
FIG. 12B is a schematic cross-sectional view of the structure illustrated in FIG. 8D taken along a line F3-F3' viewed in an arrow direction.

As illustrated in FIG. 12A, the bit line contact BLC1 includes a contact electrode V03 disposed to the circuit layer 200, a contact electrode V13 disposed at the height position corresponding to the memory mat MM0, and a contact electrode V23 disposed at the height position corresponding to the memory mat MM1.

The contact electrode V03 includes, for example, a stacked film of a barrier conductive layer of titanium nitride or the like and a metal layer of tungsten or the like. The contact electrode V03 extends in the Z-direction, and is connected to the peripheral circuit PC via the contact electrode SV (FIG. 6) disposed downward. A height position of an upper surface of the contact electrode V03 matches the height position of the lower surface of the conductive layer 301 in the memory mat MM0.

The contact electrode V13 includes, for example, a stacked film of a barrier conductive layer of titanium nitride or the like and a metal layer of tungsten or the like. The contact electrode V13 extends in the Z-direction. A lower end of the contact electrode V13 is connected to the upper surface of the contact electrode V03. A height position of an upper surface of the contact electrode V13 matches the height position of the lower surface of the barrier conductive layer 310 in the memory mat MM0.

The contact electrode V23 includes, for example, a stacked film of a barrier conductive layer of titanium nitride or the like and a metal layer of tungsten or the like. The contact electrode V23 extends in the Z-direction. A lower end of the contact electrode V23 is connected to the upper surface of the contact electrode V13. An upper end of the contact electrode V23 is connected the lower surface of the barrier conductive layer 410 in the memory mat MM1. A height position of an upper surface of the contact electrode V23 matches the height position of the lower surface of the barrier conductive layer 410 in the memory mat MM1.

Figure 12C:
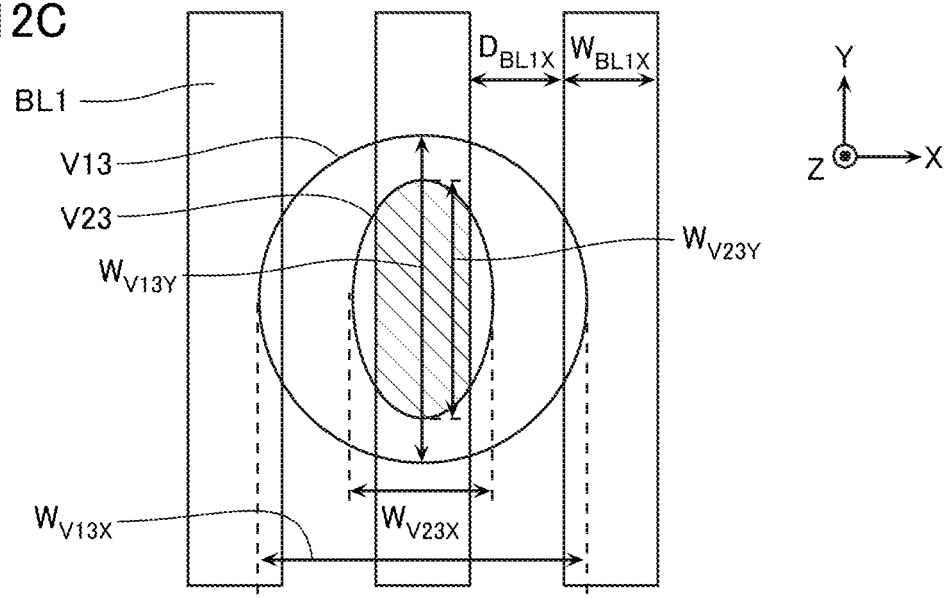
FIG. 12C is a schematic enlarged view corresponding to a part of FIG. 8D.

In FIG. 12C, a width in the X-direction of the bit line BL1 is defined as $W_{BL1X}$, and a distance between the two bit lines BL1 mutually adjacent in the X-direction is defined as $D_{BL1X}$. In the example of FIG. 12C, a width $W_{V13X}$ in the X-direction of the contact electrodes V03, V13 is larger than a sum of $W_{BL1X}$ and $2D_{BL1X}$. A width $W_{V23X}$ in the X-direction of the contact electrode V23 is larger than $W_{BL1X}$ and smaller than the sum of $W_{BL1X}$ and $2D_{BL1X}$. For example, in the example of FIG. 12B, a width in the X-direction of an upper end portion V23c of the contact electrode V23 matches the width ($W_{BL1X}$ in FIG. 12C) in the X-direction of the bit line BL1. Note that the width in the X-direction of the upper end portion V23c of the contact electrode V23 is smaller than the width ($W_{BL1X}$ in FIG. 12C) in the X-direction of the bit line BL1 in some cases. In the example of FIG. 12C, a width $W_{V13Y}$ in the Y-direction of the contact electrodes V03, V13 is about the same as the width $W_{V13X}$ in the X-direction. A width $W_{V23Y}$ in the Y-direction of the contact electrode V23 is larger than the width $W_{V23X}$ in the X-direction of the contact electrode V23 and smaller than the width $W_{V13Y}$ in the Y-direction of the contact electrodes V03, V13.

[Effects]

For example, as described with reference to FIG. 2, the semiconductor memory device according to the embodiment includes a plurality of memory mats MM0 to MM3 arranged in the Z-direction. The plurality of memory mats MM0 to MM3 include a plurality of bit lines BL0, BL1, and BL2, which extend in the Y-direction and are arranged in the X-direction, and a plurality of word lines WL0, WL1 that extend in the X-direction and are arranged in the Y-direction.

Figure 13:
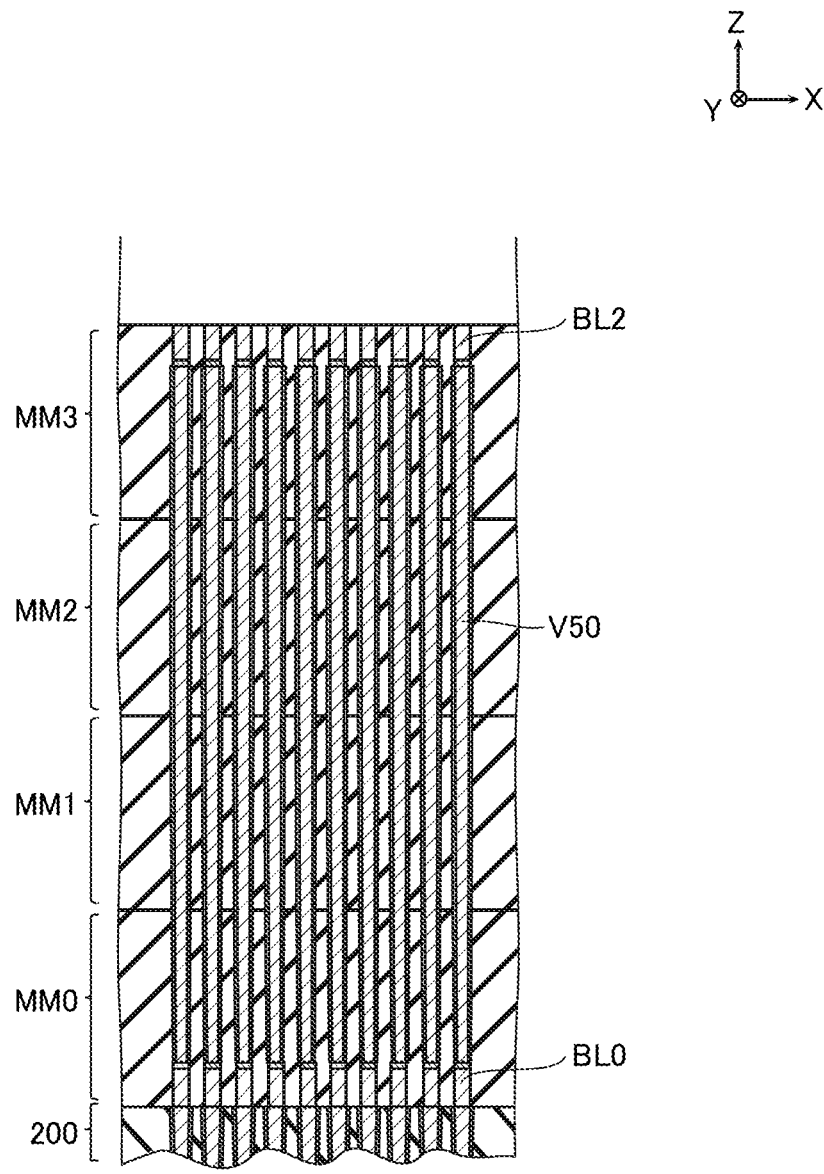
FIG. 13 is a schematic cross-sectional view illustrating a part of a configuration of a semiconductor memory device according to a comparative example.

In the semiconductor memory device having such a configuration, it is considered to connect between the bit line BL0 and the bit line BL2 for reducing the circuit area. Therefore, for example, as exemplified in FIG. 13, it is also considered to connect between the bit line BL0 and the bit line BL2 by a single contact electrode V50 extending in the Z-direction.

Figure 14:
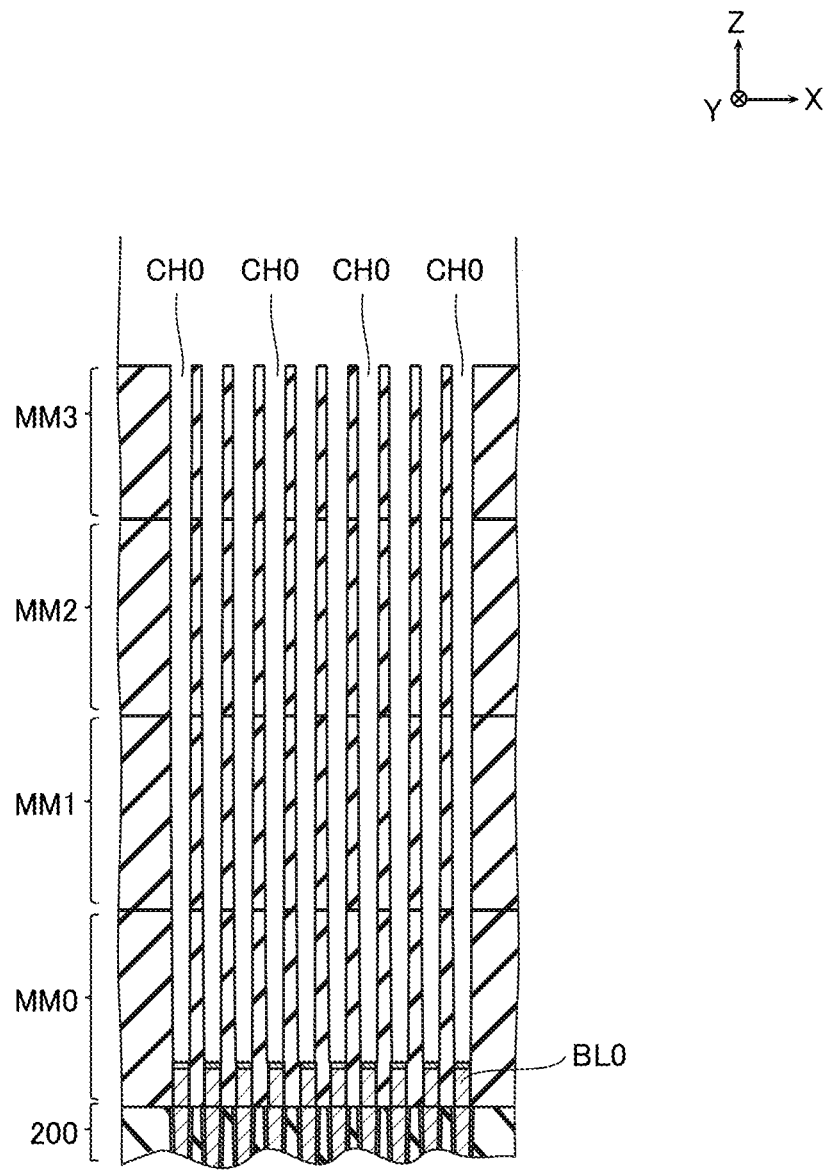
FIG. 14 is a schematic cross-sectional view for describing the semiconductor memory device according to the comparative example.
Figure 15:
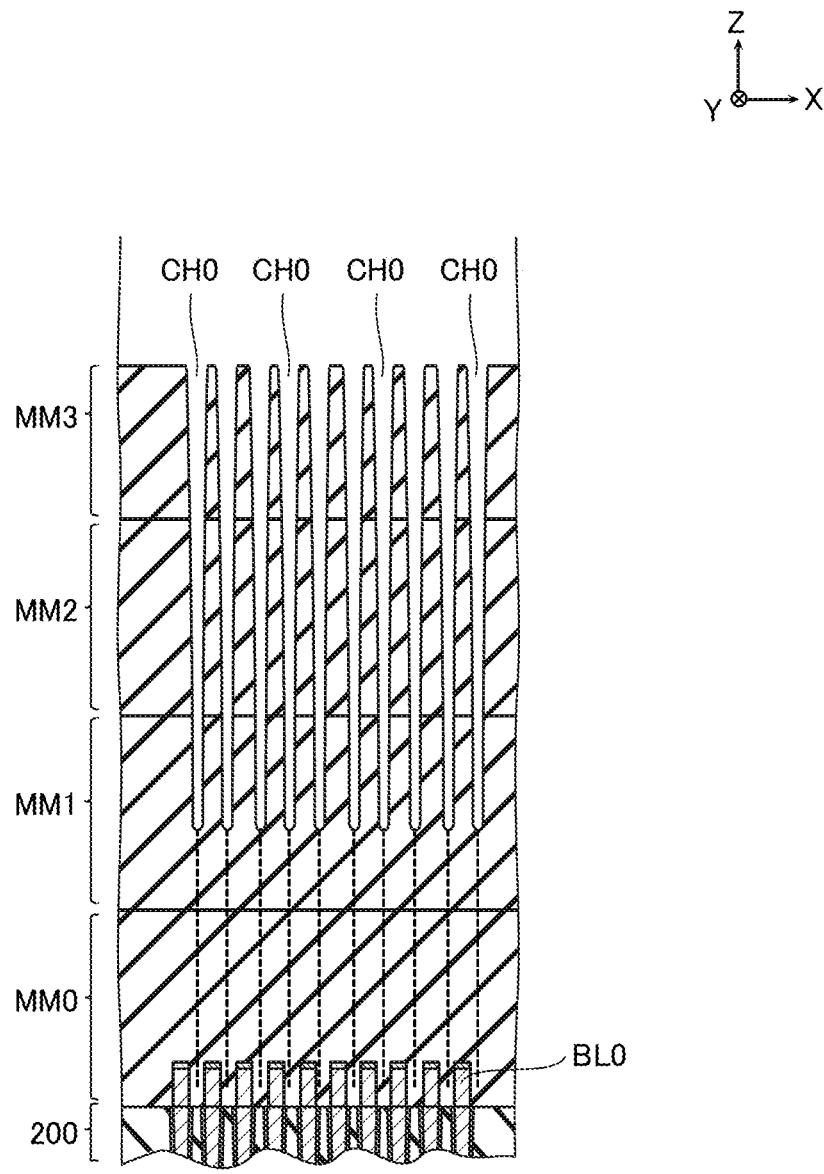
FIG. 15 is a schematic cross-sectional view for describing the semiconductor memory device according to the comparative example.

Here, when forming such a contact electrode V50, for example, as exemplified in FIG. 14, it is necessary to form contact holes CH0 that penetrate an insulating layer from the height position corresponding to the memory mat MM0 to the height position corresponding to the memory mat MM3. Here, from the aspect of miniaturization, the widths and the distances in the X-direction of the bit lines BL0, BL2 are preferably small. In this case, an aspect ratio of the contact hole CH0 possibly increases. When the aspect ratio of the contact hole CH0 is large, for example, as exemplified in FIG. 15, the contact hole CH0 fails to reach the upper surface of the bit line BL0 in some cases. In addition, a margin for position shift in the X-direction is decreased, and the connection between the bit lines BL0 and BL2 fails to be appropriately made in some cases.

Therefore, in this embodiment, the connection between the bit lines BL0 and BL2 is made by not the single contact electrode but a plurality of contact electrodes V12, V22, V32, and V42, for example, as described with reference to FIG. 11A and the like. This configuration eliminates a need for forming the contact hole CH0 with large aspect ratio in forming the bit line contact BLC0.

In this embodiment, for example, as described with reference to FIG. 11C, the width in the X-direction of the contact electrodes V22, V32 is formed to be larger than the width in the X-direction of the contact electrodes V12, V42. This configuration ensures the increased margin for the position shift in the X-direction, thus appropriately connecting between the bit lines BL0 and BL2. This configuration ensures the increased contacted area between the contact electrodes V22, V32, thus forming the bit line contact BLC0 with low resistance.

In this embodiment, for example, as described with reference to FIG. 11C, the width in the X-direction of the contact electrode V42 is formed to be larger than the width in the X-direction of the bit line BL2. This configuration ensures the decreased aspect ratio of a contact hole CH1 corresponding to the contact electrode V42.

Figure 16:
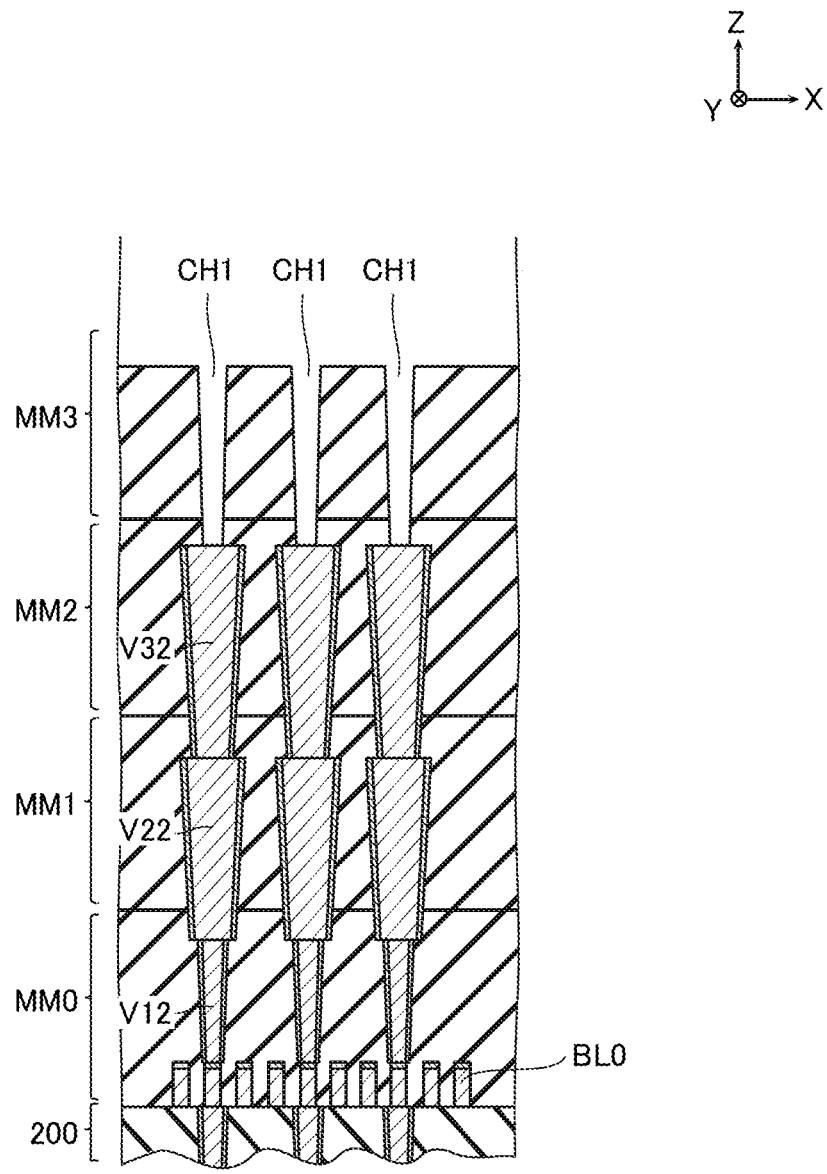
FIG. 16 is a schematic cross-sectional view for describing the semiconductor memory device according to the first embodiment.
Figure 17:
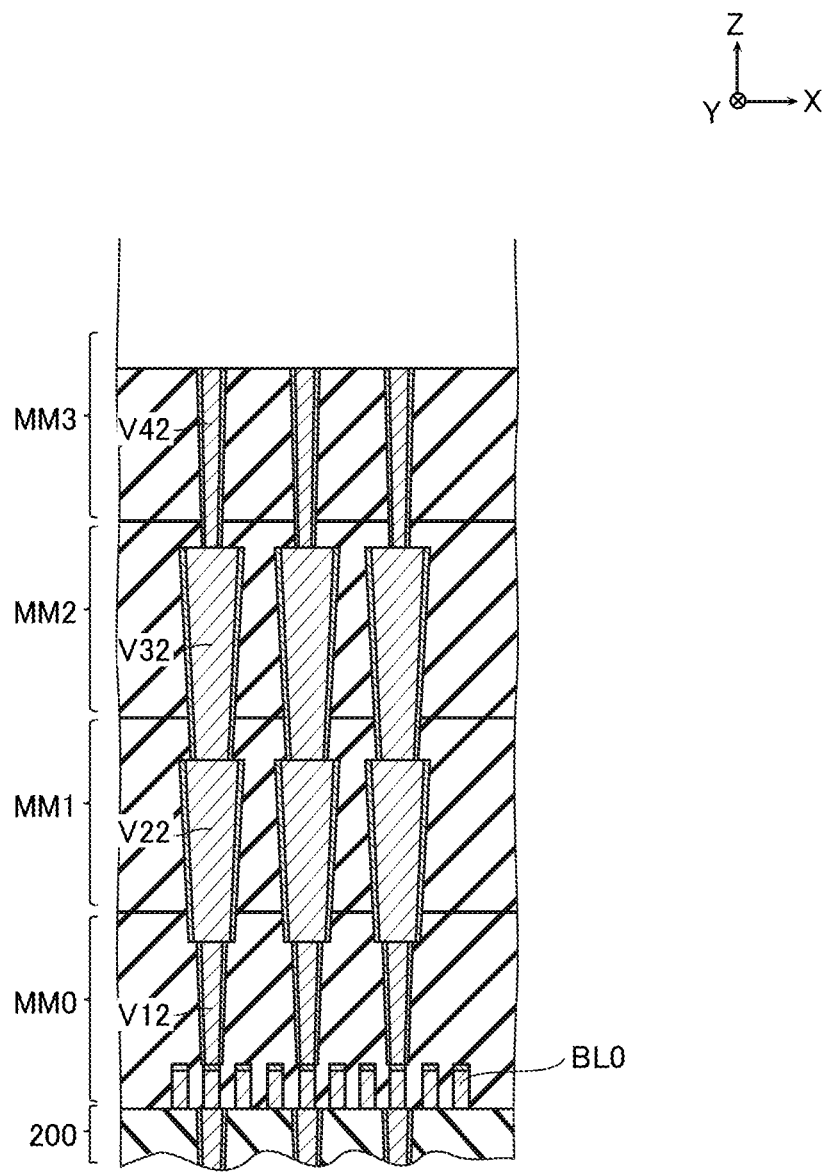
FIG. 17 is a schematic cross-sectional view for describing the semiconductor memory device.
Figure 18:
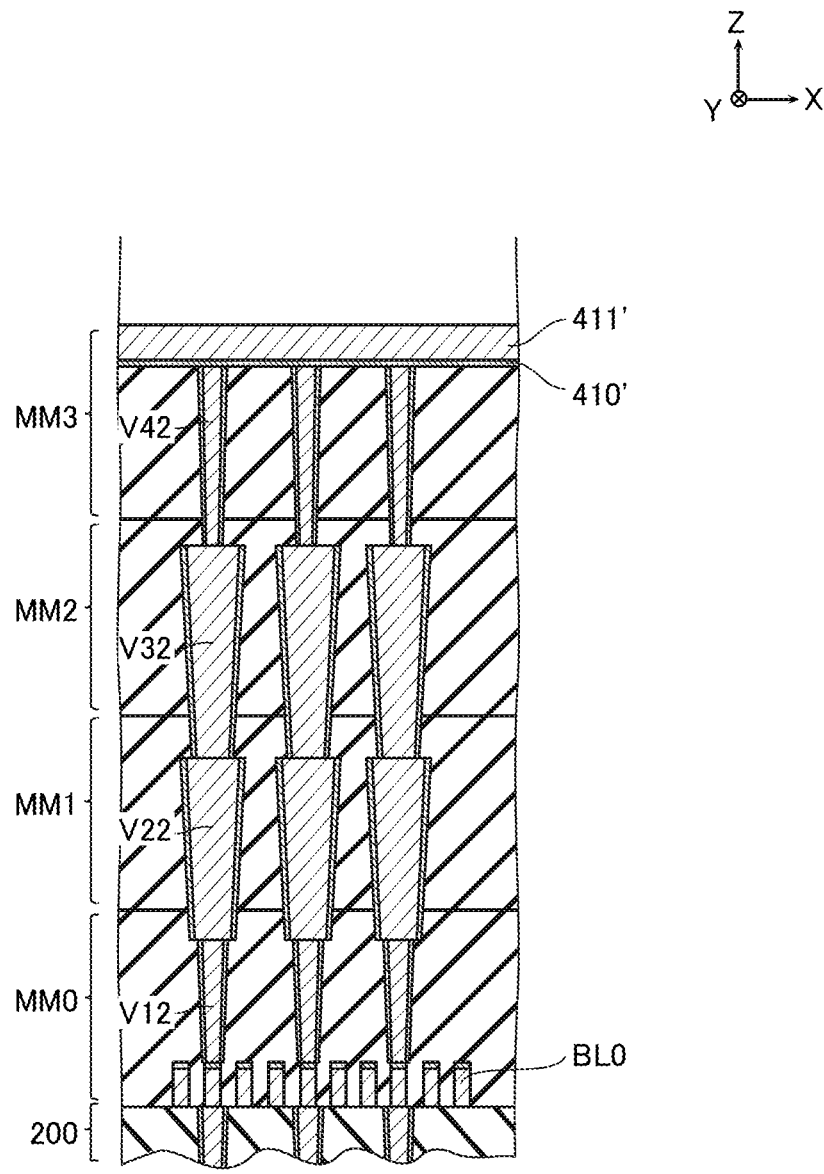
FIG. 18 is a schematic cross-sectional view for describing the semiconductor memory device.
Figure 19:
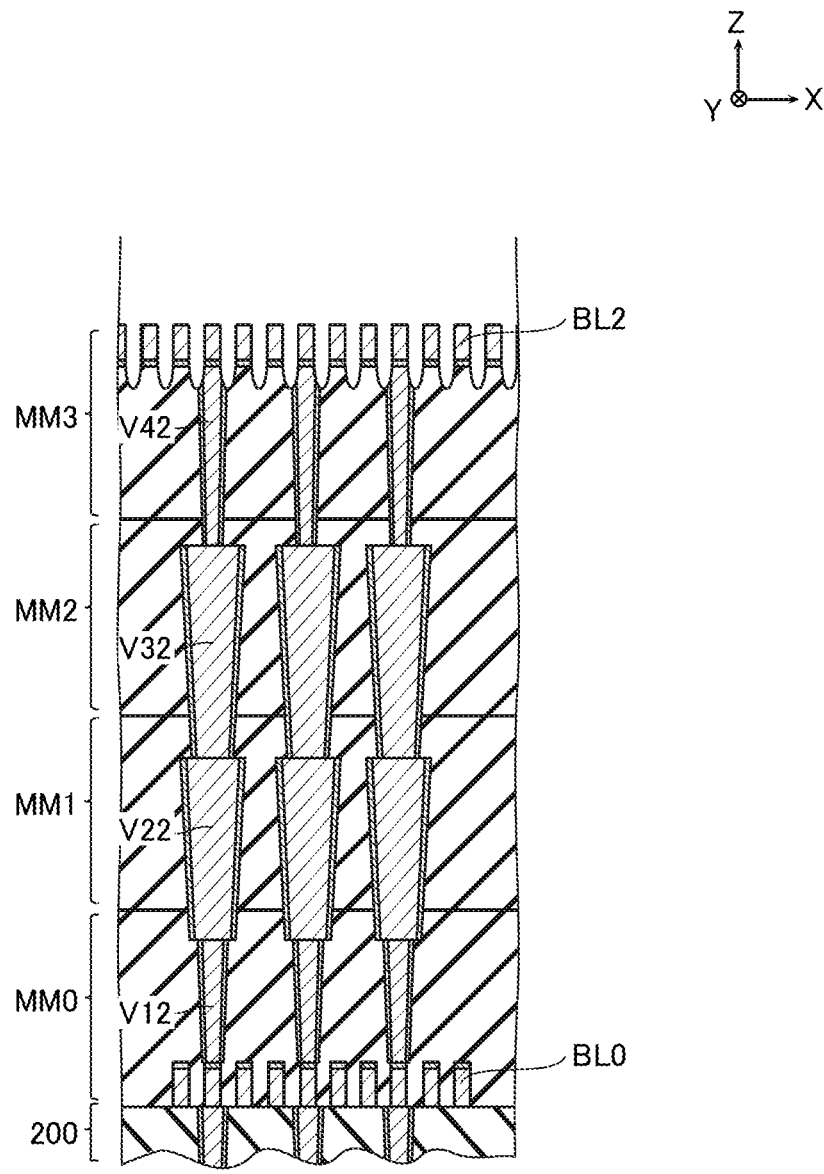
FIG. 19 is a schematic cross-sectional view for describing the semiconductor memory device.

When forming such a contact electrode V42, for example, as illustrated in FIG. 16, the contact hole CH1 having the width in the X-direction larger than that of the bit line BL2 is formed. As illustrated in FIG. 17, the contact electrode V42 is formed in the contact hole CH1. As illustrated in FIG. 18, a barrier conductive layer 410' and a conductive layer 411' are formed on the upper surface of this structure. As illustrated in FIG. 19, the barrier conductive layer 410' and the conductive layer 411' are processed to form the bit line BL2. At this time, a part of the proximity of an upper end of a contact electrode V42 is removed.

Second Embodiment

Figure 20:
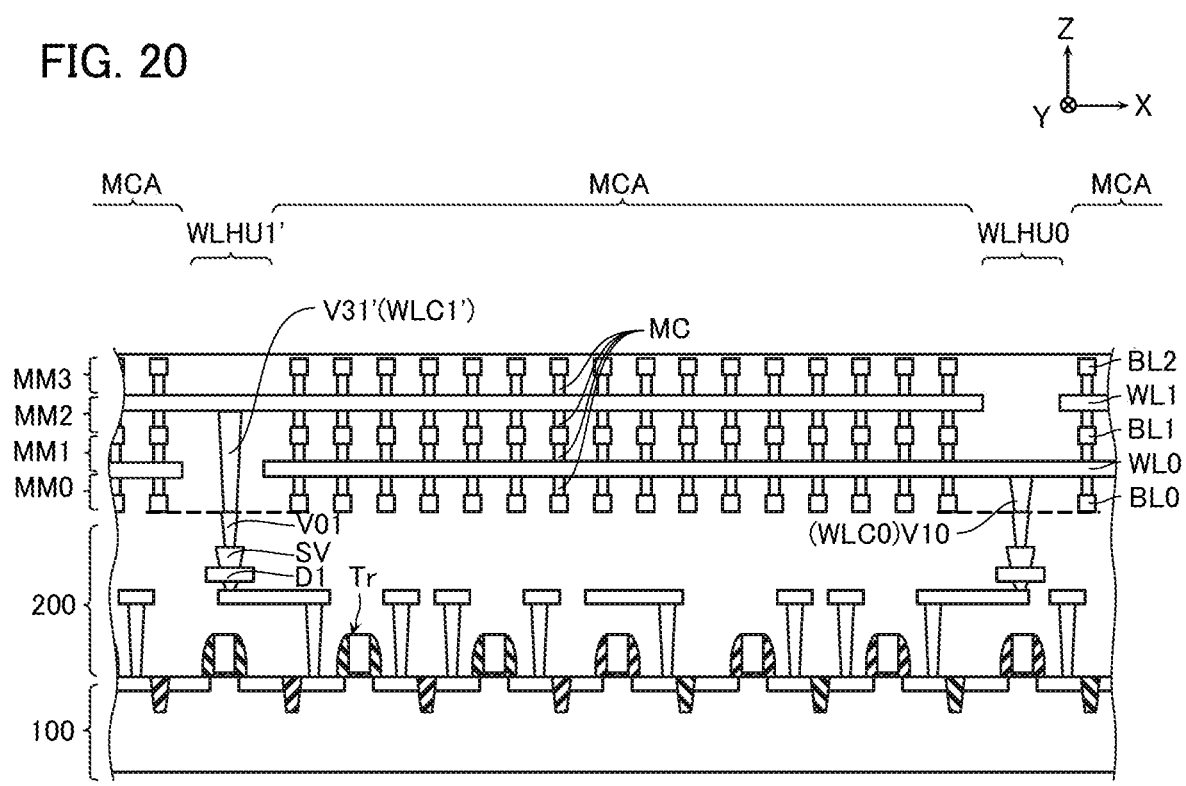
FIG. 20 is a schematic cross-sectional view for describing a semiconductor memory device according to a second embodiment.
Figure 21:
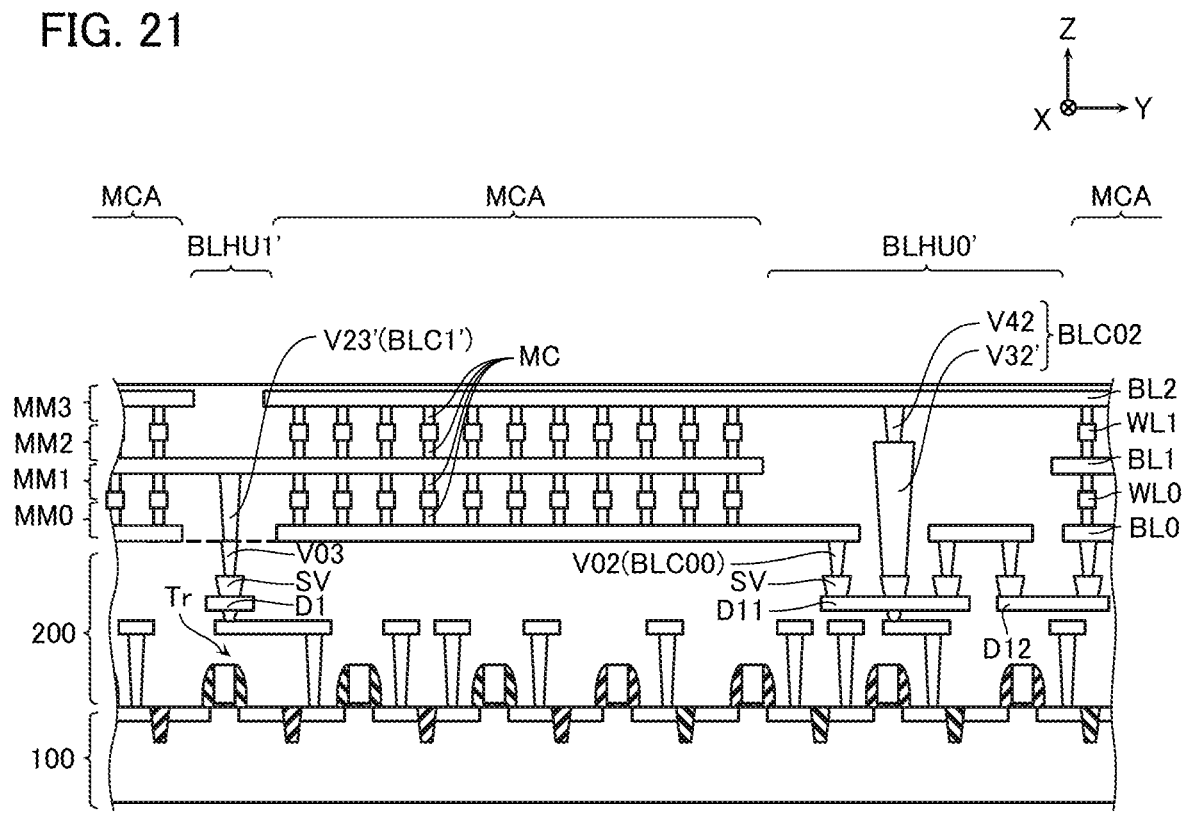
FIG. 21 is a schematic cross-sectional view for describing the semiconductor memory device.

Next, with reference to FIG. 20 to FIG. 24, a semiconductor memory device according to the second embodiment will be described. FIG. 20 and FIG. 21 are schematic cross-sectional views of the semiconductor memory device according to the embodiment, and illustrate the cross-sectional surfaces of the portions corresponding to FIG. 5 and FIG. 6, respectively. FIG. 20 and FIG. 21 are schematic views and not the cross-sectional views illustrating specific configurations of respective components. For example, wirings D11, D12 illustrated in FIG. 21 extend in the Y-direction and are connected to a plurality of contact electrodes SV arranged in the Y-direction. However, as described with reference to FIG. 22, a connecting portion of the wiring D11 to the contact electrode SV and a portion extending in the Y-direction do not appear on the same YZ cross section in some cases.

As illustrated in FIG. 20 and FIG. 21, the semiconductor memory device according to the embodiment is basically configured similarly to the semiconductor memory device according to the first embodiment. However, the semiconductor memory device according to the embodiment includes a word line hook-up region WLHU1' and bit line hook-up regions BLHU0', BLHU1' instead of the word line hook-up region WLHU1 and the bit line hook-up regions BLHU0, BLHU1.

The word line hook-up region WLHU1' is basically configured similarly to the word line hook-up region WLHU1 as illustrated in, for example, FIG. 20. Note that the word line hook-up region WLHU1' includes a word line contact WLC1' instead of the word line contact WLC1. The word line contact WLC1' is basically configured similarly to the word line contact WLC1. Note that the word line contact WLC1' includes a contact electrode V31' instead of the contact electrodes V11, V21, and V31.

The contact electrode V31' includes, for example, a stacked film of a barrier conductive layer of titanium nitride or the like and a metal layer of tungsten or the like. The contact electrode V31' extends in the Z-direction. A lower end of the contact electrode V31' is connected to the upper surface of the contact electrode V01. An upper end of the contact electrode V31' is connected to the lower surface of the barrier conductive layer 310 in the memory mat MM2. A height position of an upper surface of the contact electrode V31' matches the height position of the lower surface of the barrier conductive layer 310 in the memory mat MM2.

The bit line hook-up region BLHU1' is basically configured similarly to the bit line hook-up region BLHU1 as illustrated in, for example, FIG. 21. Note that the bit line hook-up region BLHU1' includes a bit line contact BLC1' instead of the bit line contact BLC1. The bit line contact BLC1' is basically configured similarly to the bit line contact BLC1. Note that the bit line contact BLC1' includes a contact electrode V23' instead of the contact electrodes V13, V23.

The contact electrode V23' includes, for example, a stacked film of a barrier conductive layer of titanium nitride or the like and a metal layer of tungsten or the like. The contact electrode V23' extends in the Z-direction. A lower end of the contact electrode V23' is connected to the upper surface of the contact electrode V03. An upper end of the contact electrode V23' is connected to the lower surface of the barrier conductive layer 410 in the memory mat MM1. A height position of an upper surface of the contact electrode V23' matches the height position of the lower surface of the barrier conductive layer 410 in the memory mat MM1.

Figure 22:
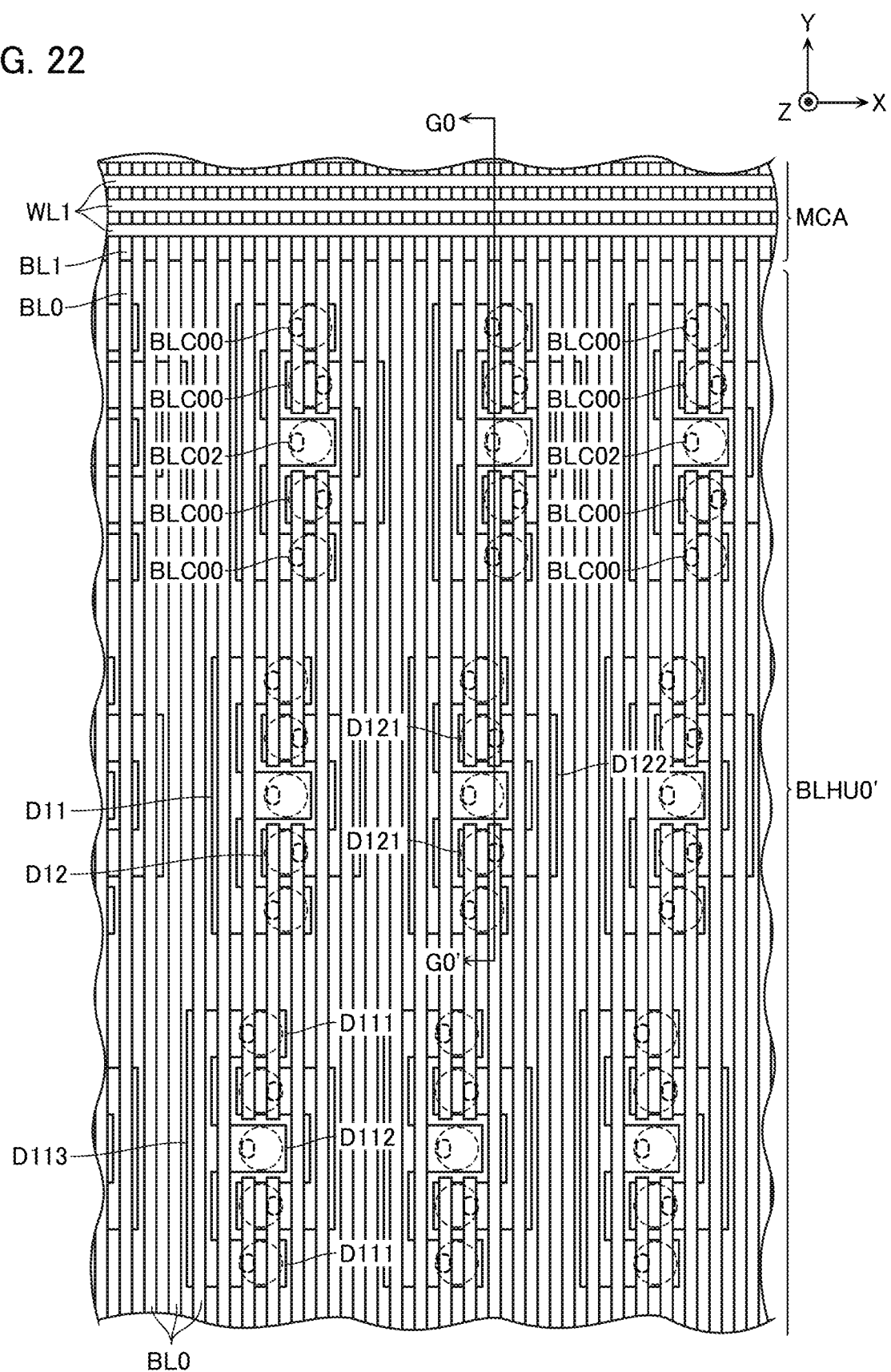
FIG. 22 is a schematic plan view for describing the semiconductor memory device.
Figure 23:
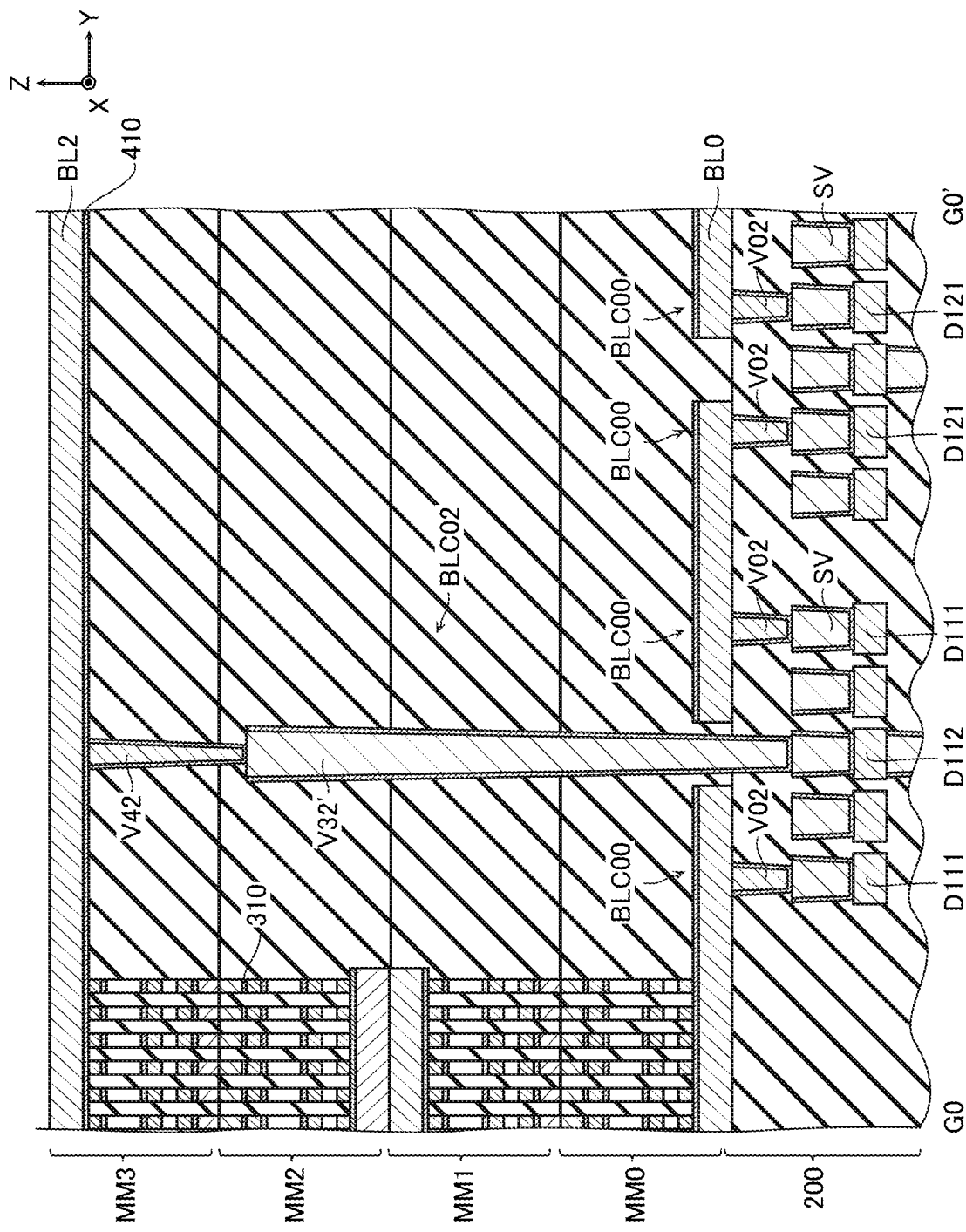
FIG. 23 is a schematic cross-sectional view for describing the semiconductor memory device.

Next, with reference to FIG. 21 to FIG. 23, a configuration of the bit line hook-up region BLHU0' according to the embodiment will be described. FIG. 22 is a schematic plan view illustrating a part of the configuration of the bit line hook-up region BLHU0'. Note that FIG. 22 omits the bit line BL2. FIG. 23 is a schematic cross-sectional view of the structure illustrated in FIG. 22 taken along a line G0-G0' viewed in an arrow direction. Note that FIG. 23 does not omit the bit line BL2.

As illustrated in FIG. 6, in the first embodiment, the two memory cell arrays MCA mutually adjacent in the Y-direction include the bit lines BL0, BL2 in common.

Here, as illustrated in FIG. 21, also in this embodiment, the two memory cell arrays MCA mutually adjacent in the Y-direction include the bit line BL2 in common. Meanwhile, in this embodiment, the two bit lines BL0 corresponding to the two memory cell arrays MCA mutually adjacent in the Y-direction are physically cut in the bit line hook-up region BLHU0'. The two bit lines BL0 are mutually electrically conducted via bit line contacts BLC00 and the wirings D11, D12 in the circuit layer 200. The two bit lines BL0 are electrically conducted with the bit line BL2 via the bit line contacts BLC00, the wiring D11 in the circuit layer 200, and a bit line contact BLC02.

As illustrated in FIG. 22, the bit line hook-up region BLHU0' includes a plurality of bit line contacts BLC02 arranged in the X-direction and the Y-direction. As illustrated in FIG. 22, the bit line hook-up region BLHU0' includes a part of a plurality of bit lines BL0 corresponding to the two memory cell arrays MCA mutually adjacent in the Y-direction. The plurality of bit lines BL0 extend in the Y-direction and are arranged in the X-direction. In the plurality of bit lines BL0, portions disposed at positions corresponding to the bit line contacts BLC02 are physically cut as described above. At proximities of cut portions of the bit lines BL0, the bit line contacts BLC00 connected to the bit lines BL0, and the wirings D11, D12 connected to the bit line contacts BLC00 are disposed.

As illustrated in FIG. 23, the bit line contact BLC00 includes a contact electrode V02. The bit line contact BLC02 includes a contact electrode V32' and a contact electrode V42.

The contact electrode V32' includes, for example, a stacked film of a barrier conductive layer of titanium nitride or the like and a metal layer of tungsten or the like. The contact electrode V32' extends in the Z-direction. A lower end of the contact electrode V32' is connected to an upper surface of the contact electrode SV. An upper end of the contact electrode V32' is connected to a lower surface of the contact electrode V42. A height position of an upper surface of the contact electrode V32' matches the height position of the lower surface of the barrier conductive layer 310 in the memory mat MM2.

Figure 24:
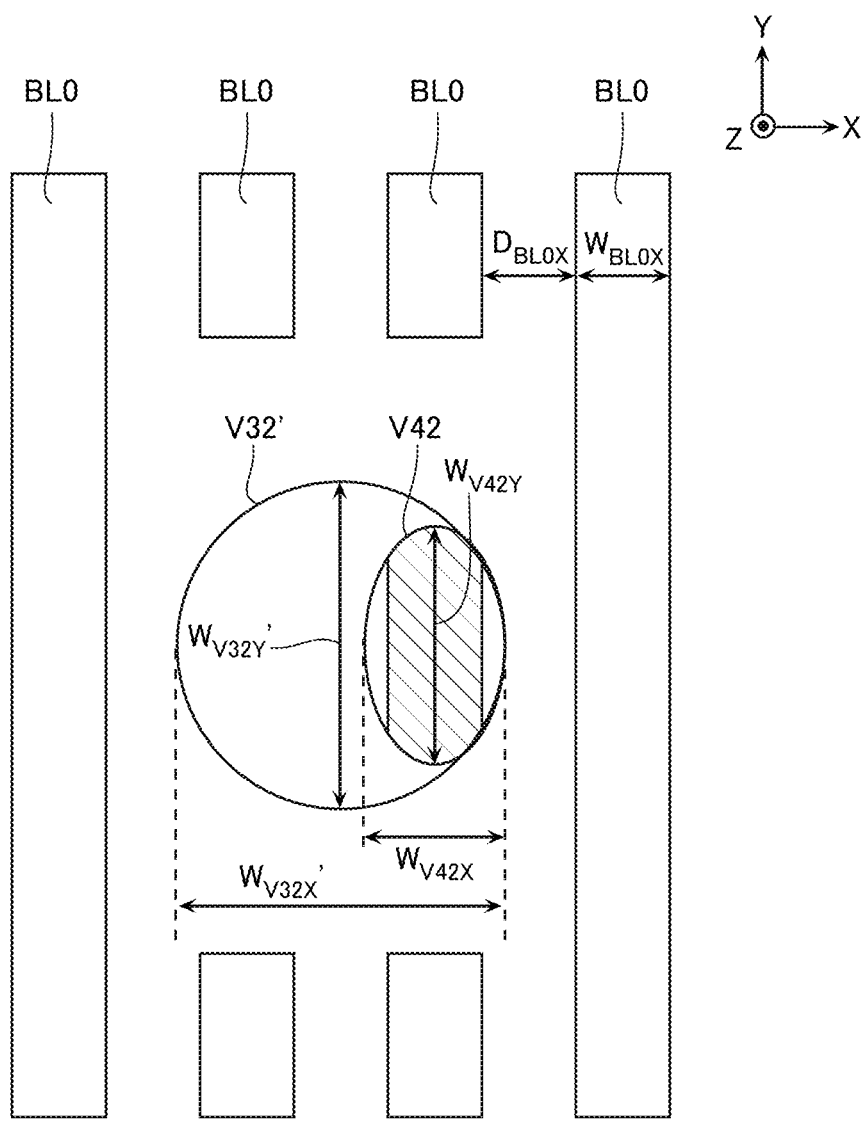
FIG. 24 is a schematic plan view for describing the semiconductor memory device.

In FIG. 24, widths in the X-direction of the bit lines BL0, BL2 are defined as $W_{BL0X}$, and distances between the two bit lines BL0, BL2 mutually adjacent in the X-direction are defined as $D_{BL0X}$. In the example of FIG. 24, a width $W_{V32X}'$ in the X-direction of the contact electrode V32' is larger than a sum of $2W_{BL0X}$ and $D_{BL0X}$. A width $W_{V42X}$ in the X-direction of the contact electrode V42 is larger than $W_{BL0X}$ and smaller than a sum of $W_{BL0X}$ and $2D_{BL0X}$. In the example of FIG. 24, a width $W_{V32Y}'$ in the Y-direction of the contact electrode V32' is about the same as the width $W_{V32X}'$ in the X-direction. The width $W_{V42Y}$ in the Y-direction of the contact electrode V42 is smaller than the width $W_{V32Y}'$ in the Y-direction of the contact electrode V32'.

As illustrated in FIG. 22, the wiring D11 includes two parts D111 that extend in the X-direction and are arranged in the Y-direction, a part D112 that extends in the X-direction and is disposed between the two parts D111, and a part D113 that extends in the Y-direction and is connected to the two parts D111 and the part D112. As illustrated in FIG. 23, the parts D111 are connected to lower ends of the respective contact electrodes V02 in the bit line contact BLC00 via the contact electrodes SV. The part D112 is connected to the lower end of the contact electrode V32' in the bit line contact BLC02 via the contact electrode SV.

As illustrated in FIG. 22, the wiring D12 includes two parts D121 that extend in the X-direction and are arranged in the Y-direction, and a part D122 that extends in the Y-direction and is connected to the two parts D121. As illustrated in FIG. 23, the parts D121 are connected to lower ends of the respective contact electrodes V02 in the two bit line contacts BLC00 via the contact electrodes SV.

[Effect]

In this embodiment, the bit line contact BL02 connected to the bit line BL2 includes the contact electrode V32', and the width $W_{V32X}'$ (FIG. 24) in the X-direction of the contact electrode V32' is larger than the width $W_{BL0X}$ (FIG. 24) in the X-direction of the bit lines BL0, BL2. Accordingly, it is not necessary to form the contact hole CH0 with large aspect ratio. In addition, the bit line contact BL02 with low resistance can be formed.

Other Embodiments

The semiconductor memory devices according to the first embodiment and the second embodiment are described above. However, the semiconductor memory devices according to the embodiments are merely examples, and the specific configuration, operation, and the like are adjustable as necessary.

Figure 25:
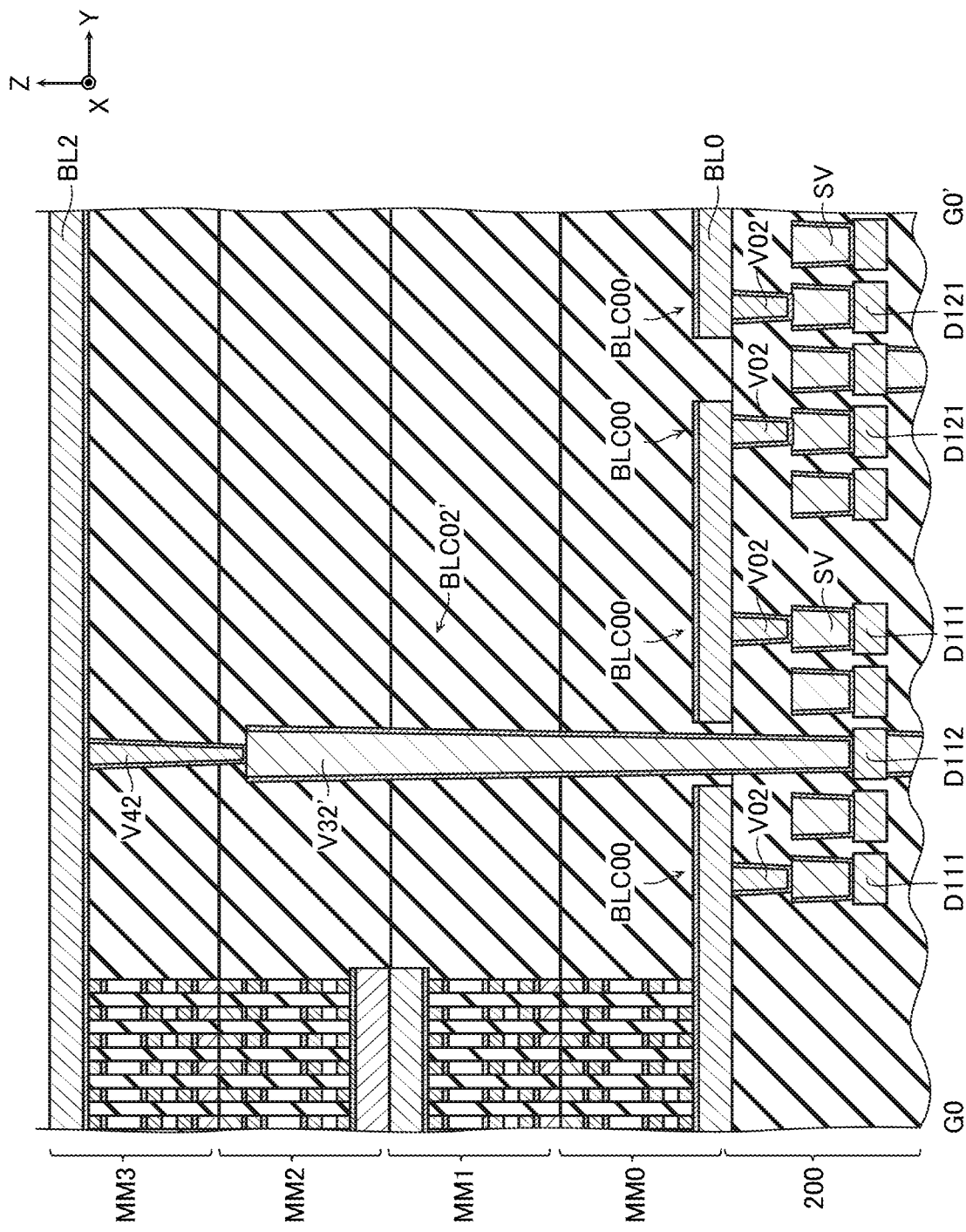
FIG. 25 is a schematic cross-sectional view for describing a semiconductor memory device according to a modification.

For example, in the first embodiment and the second embodiment, the bit line contacts BLC0, BLC1, BLC00, BLC02, and the like include a plurality of contact electrodes. The word line contacts WLC0, WLC1, and the like include a plurality of contact electrodes. Here, for example, the number of contact electrodes included in the bit line contacts BLC0, BLC1, BLC00, BLC02, and the like are adjustable as necessary. For example, the contact electrode V32' in a bit line contact BLC02' illustrated in FIG. 25 is directly connected to an upper surface of the part D112 of the wiring D11 not via the contact electrode SV.

For example, FIG. 22 illustrates shapes of the wirings D11, D12. However, the wiring D11 only needs to electrically connect the two bit lines BL0 corresponding to the two memory cell arrays MCA mutually adjacent in the Y-direction to the bit lines BL2 corresponding to the two memory cell arrays MCA. The specific shape and the like are adjustable as necessary. The wiring D12 only needs to electrically connect the two bit lines BL0 corresponding to the two memory cell arrays MCA mutually adjacent in the Y-direction, and the specific shape and the like are adjustable as necessary.

Figure 26:
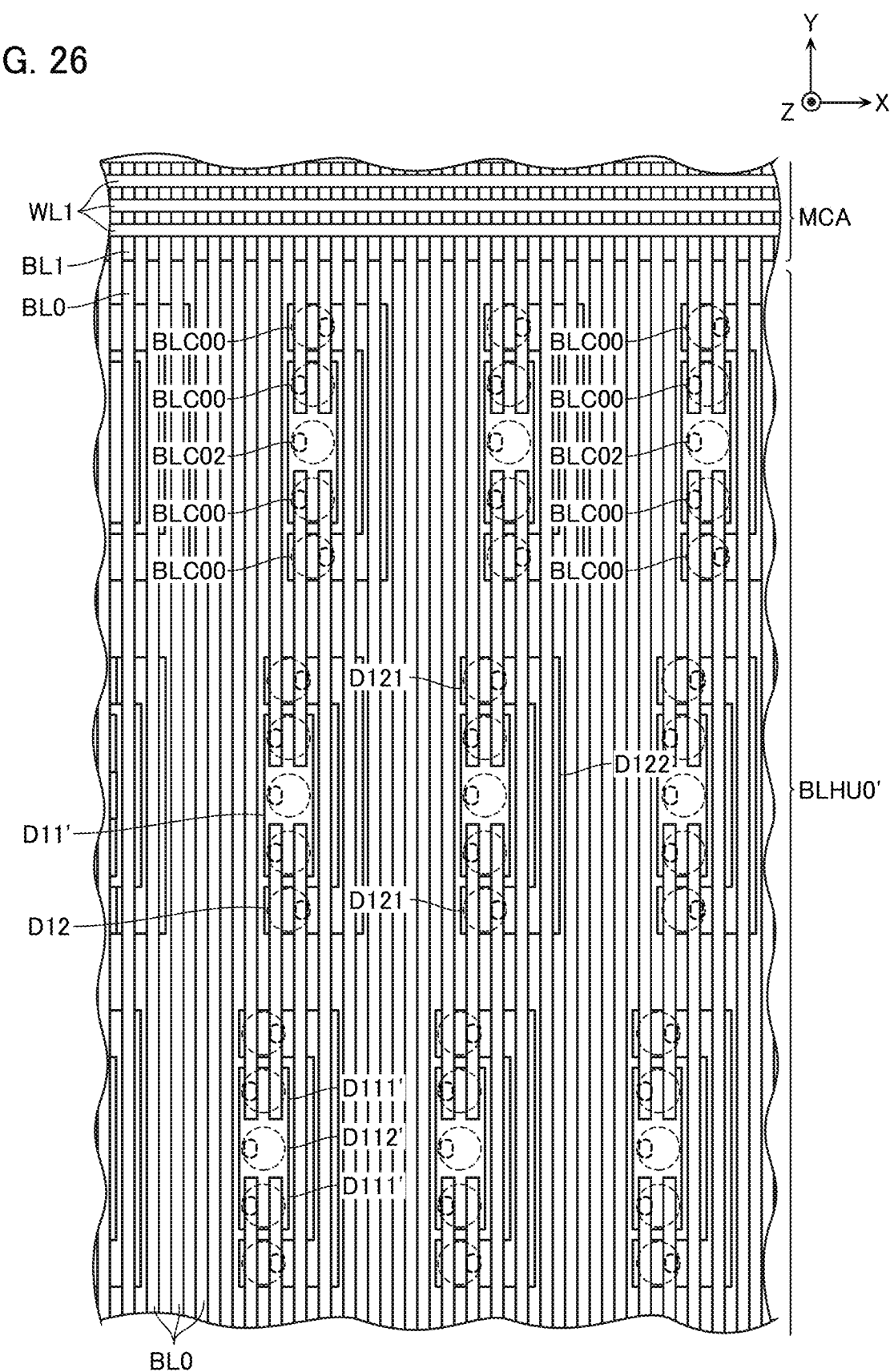
FIG. 26 is a schematic plan view for describing the semiconductor memory device according to a modification.

For example, in the example of FIG. 26, a wiring D11' is disposed instead of the wiring D11. The wiring D11' is formed in an approximately rectangular shape extending in the Y-direction. End parts D111' in the Y-direction of the wiring D11' are connected to lower ends of the respective contact electrodes V02 in the bit line contact BLC00 via the contact electrodes SV. A part D112' between the end parts D111' is connected to the lower end of the contact electrode V32' in the bit line contact BLC02 via the contact electrode SV.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a first wiring disposed to be separated from the substrate in a first direction that intersects with a surface of the substrate, the first wiring extending in a second direction that intersects with the first direction;
   a second wiring disposed between the substrate and the first wiring;
   a third wiring disposed between the substrate and the second wiring, the third wiring extending in the second direction;
   a fourth wiring disposed between the substrate and the third wiring;
   a fifth wiring disposed between the substrate and the fourth wiring, the fifth wiring extending in the second direction;
   a first memory cell connected to the first wiring and the second wiring;
   a second memory cell connected to the second wiring and the third wiring;
   a third memory cell connected to the third wiring and the fourth wiring;
   a fourth memory cell connected to the fourth wiring and the fifth wiring;
   a first contact electrode disposed between the first wiring and the fifth wiring, the first contact electrode extending in the first direction and being electrically connected to the first wiring and the fifth wiring;
   a second contact electrode disposed between the first contact electrode and the fifth wiring, the second contact electrode extending in the first direction and being electrically connected to the first wiring and the fifth wiring; and
   a third contact electrode disposed between the second contact electrode and the fifth wiring, the third contact electrode extending in the first direction and being electrically connected to the first wiring and the fifth wiring, wherein
   the second contact electrode has a width in the second direction larger than a width in the second direction of the first contact electrode and larger than a width in the second direction of the third contact electrode.

2. The semiconductor memory device according to claim 1, wherein
   the width in the second direction of the first contact electrode is larger than a width in a third direction of the first contact electrode, and the third direction intersects with the first direction and the second direction.

3. The semiconductor memory device according to claim 1, wherein
   the first contact electrode has a width in a third direction larger than a width in the third direction of the first wiring, and the third direction intersects with the first direction and the second direction.

4. The semiconductor memory device according to claim 3, wherein
   the first contact electrode has one end portion in the first direction connected to the first wiring, and
   the one end portion in the first direction of the first contact electrode has a width in the third direction equal to or smaller than the width in the third direction of the first wiring.

5. The semiconductor memory device according to claim 1, further comprising:
   a sixth wiring adjacent to the first wiring in a third direction that intersects with the first direction and the second direction; and
   a seventh wiring adjacent to the first wiring in the third direction, wherein
   the second contact electrode has a width in the third direction larger than a distance between the sixth wiring and the seventh wiring in the third direction.

6. The semiconductor memory device according to claim 1, wherein
   the second contact electrode has an end portion in the first direction on the substrate side farther from the substrate than the fourth memory cell, and
   the second contact electrode has an end portion in the first direction on an opposite side of the substrate closer to the substrate than the first memory cell.

7. The semiconductor memory device according to claim 1, further comprising:
   a sixth wiring adjacent to the first wiring in a third direction that intersects with the first direction and the second direction;
   a seventh wiring adjacent to the first wiring in the third direction;
   an eighth wiring adjacent to the fifth wiring in the third direction;

a ninth wiring adjacent to the fifth wiring in the third direction;
a fifth memory cell connected to the sixth wiring and the second wiring;
a sixth memory cell connected to the seventh wiring and the second wiring;
a fourth contact electrode disposed between the sixth wiring and the eighth wiring, the fourth contact electrode extending in the first direction and being electrically connected to the sixth wiring and the eighth wiring; and
a fifth contact electrode disposed between the seventh wiring and the ninth wiring, the fifth contact electrode extending in the first direction and being electrically connected to the seventh wiring and the ninth wiring, wherein
a distance between the first contact electrode and the second wiring in the second direction is smaller than a distance between the fourth contact electrode and the second wiring in the second direction, and
the distance between the fourth contact electrode and the second wiring in the second direction is smaller than a distance between the fifth contact electrode and the second wiring in the second direction.

8. A semiconductor memory device comprising:
a substrate;
a first wiring disposed to be separated from the substrate in a first direction that intersects with a surface of the substrate, the first wiring extending in a second direction that intersects with the first direction;
a second wiring disposed between the substrate and the first wiring;
a third wiring disposed between the substrate and the second wiring, the third wiring extending in the second direction;
a fourth wiring disposed between the substrate and the third wiring;
a fifth wiring disposed between the substrate and the fourth wiring, the fifth wiring extending in the second direction;
a first memory cell connected to the first wiring and the second wiring;
a second memory cell connected to the second wiring and the third wiring;
a third memory cell connected to the third wiring and the fourth wiring;
a fourth memory cell connected to the fourth wiring and the fifth wiring;
a sixth wiring disposed between the substrate and the fifth wiring;
a first contact electrode disposed between the first wiring and the sixth wiring, the first contact electrode extending in the first direction and being electrically connected to the first wiring and the sixth wiring;
a second contact electrode disposed between the first contact electrode and the sixth wiring, the second contact electrode extending in the first direction and being electrically connected to the first wiring and the sixth wiring; and
a third contact electrode disposed between the fifth wiring and the sixth wiring, the third contact electrode extending in the first direction and being electrically connected to the fifth wiring and the sixth wiring, wherein
the second contact electrode has a width in the second direction larger than a width in the second direction of the first contact electrode.

9. The semiconductor memory device according to claim 8, wherein
the width in the second direction of the first contact electrode is larger than a width in a third direction of the first contact electrode, and the third direction intersects with the first direction and the second direction.

10. The semiconductor memory device according to claim 8, wherein
the first contact electrode has a width in a third direction larger than a width in the third direction of the first wiring, and the third direction intersects with the first direction and the second direction.

11. The semiconductor memory device according to claim 10, wherein
the first contact electrode has one end portion in the first direction connected to the first wiring, and
the one end portion in the first direction of the first contact electrode has a width in the third direction equal to or smaller than the width in the third direction of the first wiring.

12. The semiconductor memory device according to claim 8, further comprising:
a seventh wiring disposed to be separated from the fifth wiring in the second direction, the seventh wiring extending in the second direction; and
a fourth contact electrode disposed between the seventh wiring and the sixth wiring, the fourth contact electrode extending in the first direction and being electrically connected to the seventh wiring and the sixth wiring, wherein
the second contact electrode is disposed between the fifth wiring and the seventh wiring in the second direction.

13. The semiconductor memory device according to claim 12, further comprising:
an eighth wiring adjacent to the fifth wiring in a third direction that intersects with the first direction and the second direction, the eighth wiring extending in the second direction;
a ninth wiring adjacent to the seventh wiring in the third direction, the ninth wiring extending in the second direction, wherein
the second contact electrode is disposed between the eighth wiring and the ninth wiring in the second direction.

14. The semiconductor memory device according to claim 13, further comprising:
a tenth wiring disposed between the substrate and the eighth wiring;
a fifth contact electrode disposed between the eighth wiring and the tenth wiring, the fifth contact electrode extending in the first direction and being electrically connected to the eighth wiring and the tenth wiring; and
a sixth contact electrode disposed between the ninth wiring and the tenth wiring, the sixth contact electrode extending in the first direction and being electrically connected to the ninth wiring and the tenth wiring.

15. The semiconductor memory device according to claim 14, wherein
the sixth wiring includes:
a first part that extends in the third direction and is connected to the second contact electrode;
a second part that extends in the third direction and is connected to the third contact electrode;
a third part that extends in the third direction and is connected to the fourth contact electrode; and a fourth part that extends in the second direction and is connected to the first part, the second part, and the third part.

16. The semiconductor memory device according to claim 14, wherein
the tenth wiring includes:
a fifth part that extends in the third direction and is connected to the fifth contact electrode;
a sixth part that extends in the third direction and is connected to the sixth contact electrode; and
a seventh part that extends in the second direction and is connected to the fifth part and the sixth part.

* * * * *